United States Patent [19]

Wood et al.

[11] Patent Number: 5,557,506
[45] Date of Patent: Sep. 17, 1996

[54] EXPANDABLE DATA PROCESSING CHASSIS AND METHOD OF ASSEMBLY THEREOF

[75] Inventors: Samuel F. Wood, Los Altos Hills; John F. Wakerly, Mountain View, both of Calif.

[73] Assignee: Alantec, San Jose, Calif.

[21] Appl. No.: 414,771

[22] Filed: Mar. 31, 1995

[51] Int. Cl.⁶ .................................................. H05K 7/14
[52] U.S. Cl. .......................... 361/796; 361/729; 361/752; 439/61; 439/74
[58] Field of Search .................................... 361/752, 796, 361/729, 797, 733; 439/61, 62, 74, 75, 928, 77; 312/108, 111; 364/708; 174/50

[56] References Cited

U.S. PATENT DOCUMENTS

| | | | |
|---|---|---|---|
| 4,530,066 | 7/1985 | Ohwaki et al. | 364/708 |
| 4,682,833 | 7/1987 | Ferchau et al. | 439/377 |
| 4,703,394 | 10/1987 | Petit et al. | 361/413 |
| 4,840,570 | 6/1989 | Mann, Jr. et al. | 439/74 |
| 4,934,764 | 6/1990 | Leiterman et al. | 312/111 |
| 4,971,563 | 11/1990 | Wells, III | 439/61 |
| 5,006,959 | 4/1991 | Freige et al. | 361/384 |
| 5,119,497 | 6/1992 | Freige et al. | 395/750 |
| 5,227,957 | 7/1993 | Deters | 361/395 |
| 5,297,000 | 3/1994 | Freige et al. | 361/692 |
| 5,313,699 | 5/1994 | Freige et al. | 29/632 |
| 5,348,482 | 9/1994 | Rudy, Jr. et al. | 439/61 |

*Primary Examiner*—Leo P. Picard
*Assistant Examiner*—Y. Whang
*Attorney, Agent, or Firm*—Albert C. Smith; Lisa D. Noble

[57] ABSTRACT

An expandable data processing chassis and method of assembly of an expandable data processing chassis includes stackable circuit board housings and a central circuit board housing. The stackable circuit board housings and the central housing each have a rigid interlockable stabilizing frame plate to maintain mechanical tolerances as stackable circuit board housings are added to the stack. Each of the circuit board housings also has an associated backplane for coupling the circuit boards received in each housing to each other and to the central housing. The backplanes also extend to a power backplane for supplying power to the circuit boards received in the expandable data processing chassis.

18 Claims, 21 Drawing Sheets

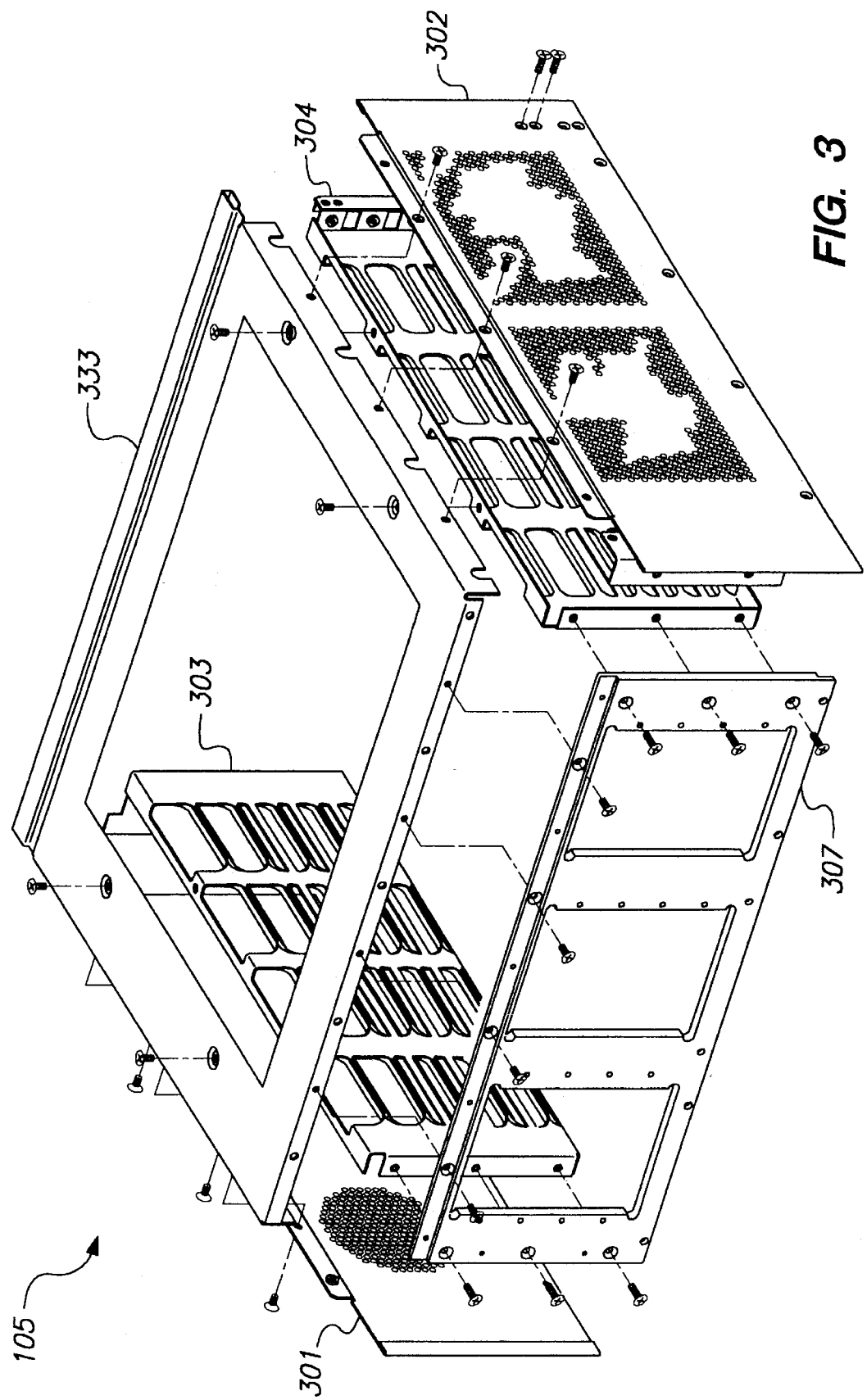

EXPANDABLE DATA PROCESSING CHASSIS AND METHOD OF ASSEMBLY THEREOF

BACKGROUND OF THE INVENTION

1. Field of the Invention

This invention relates to an expandable data processing system and more particularly to an expandable processing chassis having a modular backplane for distributing high-speed signals.

2. Description of the Related Art

In conventional data processing and communications systems, circuit boards or circuit board "modules" are housed in a circuit housing such as a "card cage" or a circuit board "shelf." Each circuit housing is generally capable of housing multiple circuit boards which are coupled by a common backplane. A backplane is a planar circuit, designed to electrically couple circuit boards which are mounted perpendicular to the backplane. A data processing system can be built using a circuit housing containing multiple circuit boards interconnected by a single backplane.

As a user's processing requirements increase, it is generally most cost effective to expand an existing data processing system rather than to install an entirely new system. Therefore, expandability is a desirable feature of a data processing system. Data processing systems are commonly expanded by incorporating additional circuit board housings into a processing system. In such systems, each circuit housing has a dedicated backplane which interconnects the circuit boards contained in each housing. Conventionally, the backplanes of multiple circuit housings are interconnected using cables or electrical connectors. Such interconnection, however, introduces undesired signal degradation, when processing high frequency signals. Impedance mismatch between the cable and the backplane and impedance discontinuities at the connectors introduce undesired transmission-line effects in high-speed systems. Thus, there is a need for an expandable high-speed processing system which does not generate undesired transmission-line effects.

SUMMARY OF THE INVENTION

In accordance with the present invention, there is provided an apparatus and a method of manufacture of an expandable high-speed processing system. Expandability is achieved using a modular backplane system, stackable shelves, and power expansion units. A single backplane interconnects the circuit boards (plug-in modules) within a circuit board housing (shelf). Each backplane also extends to and electrically couples to a central processing housing (shelf) which houses one or more central processing boards also called central plug-in modules. Thus, each group of circuit boards in a housing shares a backplane not only with each other but also with the central processing shelf. Therefore, the central processing shelf is directly coupled to multiple backplanes.

In one embodiment, each backplane has a plurality of vertically aligned connectors. Each backplane is coupled to a circuit board housing such that the connectors on each backplane are aligned to enable the housings to accommodate circuit boards having a uniform form factor. In another embodiment, the modular backplanes are each extended to couple to a power supply module which houses one or more power supplies. Each backplane then distributes power to the associated circuit board housing.

In another embodiment, stackable circuit board housings are interconnected by a series of interlocking frame plates to obtain precision alignment. These frame plates are coupled to each housing and securely interlock to form a rigid frame to which another housing may be added. Groups of circuit boards which are received in each circuit housing in the stack are interconnected by a backplane mounted to the circuit board housing. Each backplane mounted to a circuit board housing also extends to a central circuit board housing to electrically couple the group of boards to the central circuit board housing.

In another embodiment, circuit boards are housed in card cages or shelves. The expandable data processing chassis is expanded by inserting additional circuit boards into the shelves configured in the chassis or by adding an additional shelf to the chassis. In accordance with this embodiment, a modular backplane has a shape, connector configuration and connector coupling which facilitates the addition of an expansion backplane and results in coupling circuit boards coupled to the first backplane to circuit boards coupled to the expansion backplane.

BRIEF DESCRIPTION OF THE DRAWINGS

FIG. 3 is an exploded three-quarter perspective view of a shelf in accordance with the present invention;

DESCRIPTION OF THE PREFERRED EMBODIMENTS

First Embodiment

Figures 1A, 1B:
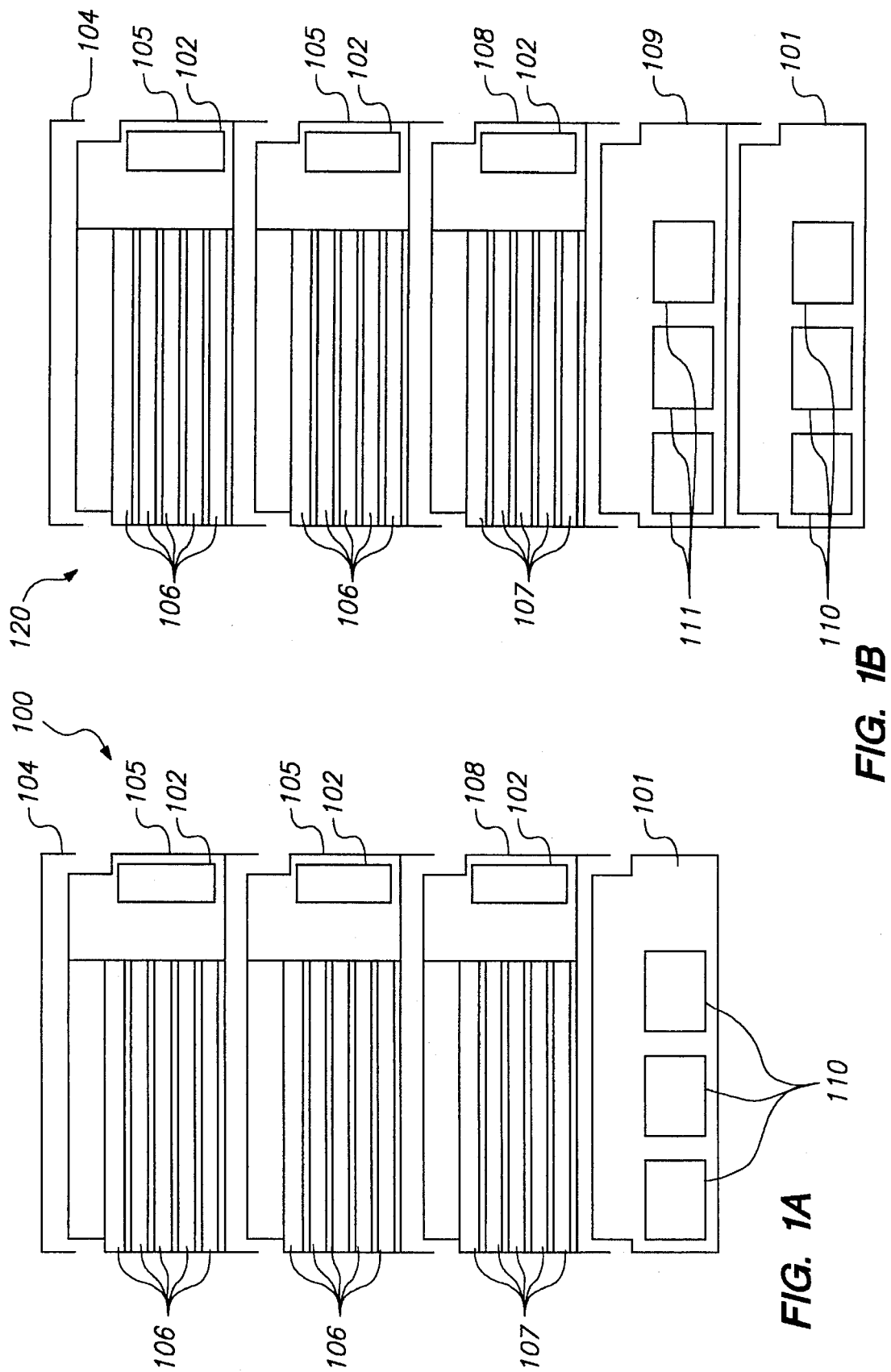
FIG. 1A is a front view of an expandable data processing chassis in accordance with the present invention.
FIG. 1B is a front view of an expandable data processing chassis in accordance with the present invention.

There is illustrated in FIG. 1A a front view of an expandable data processing chassis 100 in accordance with the present invention. Expandable data processing chassis 100 contains base unit 101, central shelf 108, mid sections (shelf sections or shelves) 105 and top section 104.

Base unit 101 is the bottom section of the expandable data processing chassis 100 and has bays 110 for receiving power supply modules for supplying power to shelf sections 105 and central shelf 108. In the illustrated embodiment, base unit 101 has three bays 110, each designed to receive a power supply module. It should be noted that the principles of the present invention apply equally to a base unit 101 having a single fixed power supply or any number of bays 110, for example four bays to receive up to four power supplies.

Shelves 105 are circuit card chassis, circuit board housings or card cages designed to receive plug-in modules (circuit modules) 106 which are circuit cards (circuit boards). In the illustrated embodiment, shelf 105 is designed to receive up to five plug-in modules 106. Each plug-in module 106 contains circuitry which processes data to facilitate data communications over a communications network, for example over a packet-switched network. Because shelf 105 receives plug-in modules 106 containing communications circuitry, shelf 105 is also called a communications shelf. It should be noted that shelves 105 could alternatively be designed to house a single plug-in module or any number of plug-in modules.

Central shelf 108 is a circuit card chassis, circuit board housing or card cage designed to receive central plug-in modules (common cards or common modules) 107 which are circuit cards (circuit boards). In the illustrated embodiment, central shelf 108 is designed to receive up to five circuit modules including plug-in modules 106 and central plug-in modules 107. Each central plug-in module 107 contains circuitry which facilitates communications with a communications network. In the illustrated embodiment, central plug-in module 107 has circuitry to control the data flow between each plug-in module 106 and a packet-switched communications network to which data processing chassis 100 is coupled. In the illustrated embodiment, central shelf 108 is designed to receive up to five central plug-in modules 107. It should be noted that central shelf 108 could alternatively be designed to house a single central plug-in module or any number of central plug-in modules. It should also be noted that although plug-in modules 106 and 107 of the illustrated embodiment contain communications circuitry, the principles of the present invention apply equally to plug-in modules having circuitry designed for other purposes.

Shelves 105 and central shelf 108 each have a fan module 102 to provide cooling for the associated shelf 105 or 108. Central shelf 108 attaches to base unit 101. Shelves 105 attach to an adjacent shelf 105 and/or to central shelf 108 to form an expandable stack of shelves 105.

Although expandable chassis 100 as illustrated has two shelves 105, additional shelves may be added to expandable chassis 100 to increase the capacity of expandable chassis 100. Capacity means the maximum number of plug-in modules 106 that may be used in the data processing system. Alternatively an expandable chassis may be assembled having only one shelf 105. Such a one shelf expandable chassis is expanded by adding additional shelves 105 to expandable chassis 100.

Top section 104 is a top cover section made typically from sheet metal to provide electrical shielding to chassis 100 and to protect plug-in modules 106 and 107 from dust and other contaminants.

There is illustrated in FIG. 1B a front view of an expandable data processing chassis 120 in accordance with the present invention. Expandable data processing chassis 120 contains base unit 101, power expansion unit 109, central shelf 108, mid sections (shelf sections or shelves) 105 and top section 104. Power expansion unit 109 has three bays 111 for receiving additional power supply modules.

Figure 2A:
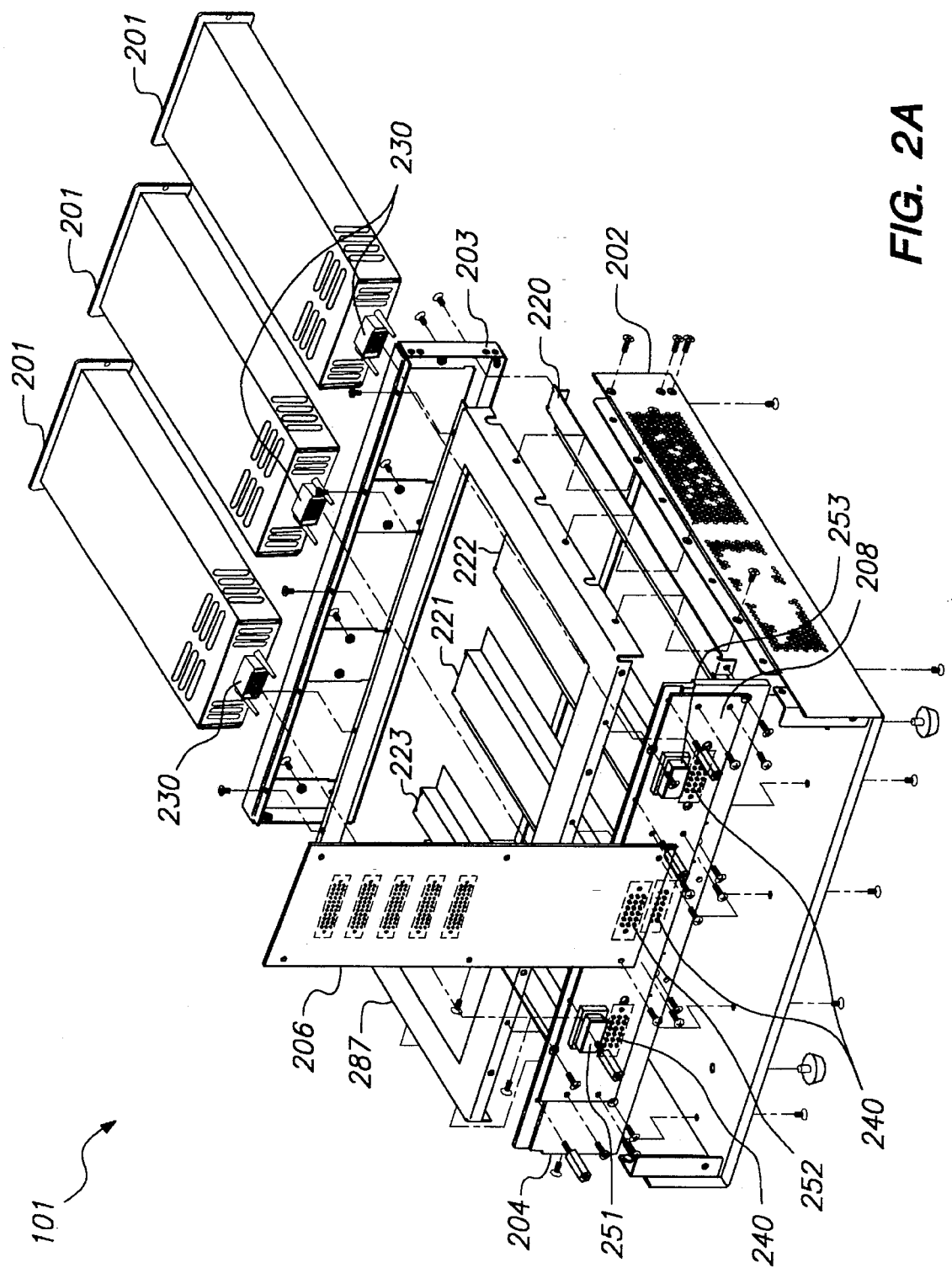
FIG. 2A is an exploded three-quarter perspective view of a base unit of an expandable data processing chassis in accordance with the present invention.

There is illustrated in FIG. 2A an exploded three-quarter view of base unit 101 with three power supplies 201 inserted into bays 110 of base unit 101. Base unit 101 forms the base for expandable chassis 100, 120. Frame 202 is a U-shaped steel shroud which forms the bottom and sides of base unit 101. Front panel 203 is fastened to frame 202 and has three openings to accommodate power supplies 201. Slides 220, 221, 222, 223 mount to the bottom of frame 202 and run from front panel 203 to stabilizing plate 204 to provide guides for inserting power supplies 201. Power supplies 201 are slid along slides 220, 221, 222, 223 until fully seated to mate power supply rear connectors 230 with power backplane connectors 240. A protective back cover made *typically from sheet metal may also be added to base unit 101 to provide electrical shielding to base unit 101 and protect power supplies 201 as well as any other components of base unit 101 from dust and other contaminants. Stabilizing plate 204 is mounted to the rear of frame 202. Stabilizing plate 204 is a rigid plate designed to hold a tight mechanical tolerance to provide the reference for the mechanical stability of expandable chassis 100. In the illustrated embodiment, stabilizing plate 204 is a 0.25 inch thick machined aluminum plate. Ceiling 287 provides the mechanical rigidity and support necessary to provide strength to the sides of frame 202. The ceiling unit 287 also provides a mounting point for stabilizing plate 204. Stabilizing plate 204 is machined to provide a precise fit and reference for any attached components such as power backplane 208. Power backplane 208 has connectors 251, 252, 253 for mating to corresponding connectors 551, 552, 553 on backplanes 205, 206, 207 (illustrated in FIGS. 5A and 5B). Power backplane 208 distributes power signals received through power backplane connectors 240 from power supplies 201 to backplanes 205, 206 and 207.

Backplanes 205, 206 and 207 are printed circuit boards used to carry power received from power backplane 208 to other components of expandable chassis 100, for example to shelves 105 (to power plug-in modules 106 and fan module 102) and central module 108 (to power central plug-in modules 107 and fan module 102). Backplanes 205, 206, 207 also electrically couple plug-in modules 106, 107 to provide electrical paths for other electrical signals such as data and control signals.

Figure 2B:
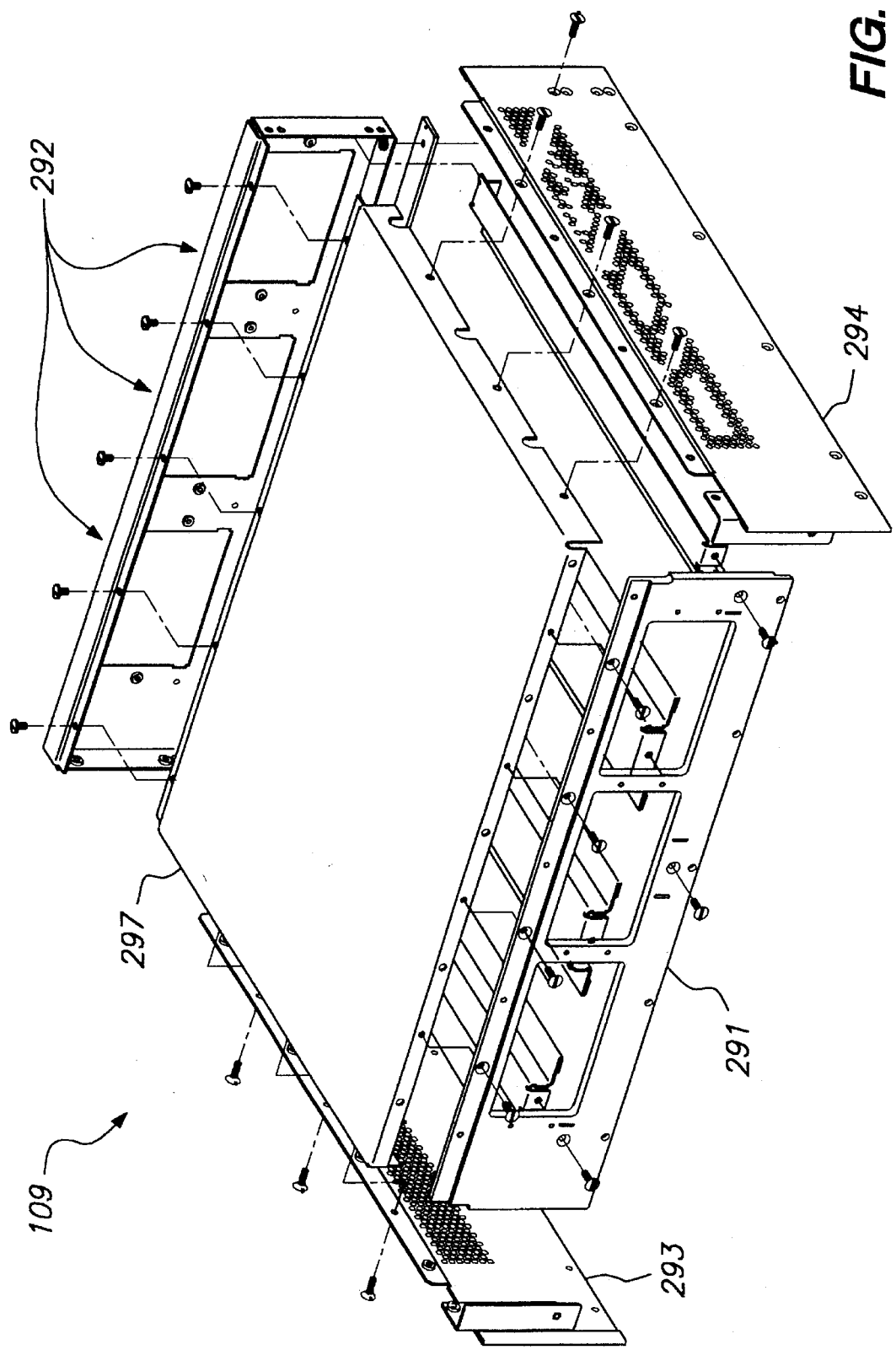
FIG. 2B is an exploded three-quarter perspective view of a power expansion unit in accordance with the present invention.

There is illustrated in FIG. 2B an exploded three-quarter view of power expansion unit 109. Power expansion unit 109 can optionally be added to expandable chassis 100. Power expansion unit 109 has a stabilizing frame plate 291 and three bays 292 for receiving additional power supplies. Stabilizing frame plate 291 is formed from a rigid material such as 0.25 inch thick aluminum and is machined to achieve precise mechanical tolerances. Ceiling 297 provides the mechanical rigidity and support necessary to provide strength to the side sheets 293 and 294 of power expansion unit 109. The ceiling 287 also provides a mounting point for stabilizing plate 291. Stabilizing frame plate 291 aligns and secures a power supply expansion unit 109 added to chassis 100. Power expansion unit 109 is added to chassis 100 by removing shelves 105 and 108 and securing power expansion unit 109 to base unit 101 to form chassis 120. Stabilizing plate 291 has a machined lip to interlock with an adjacent plate upon addition to chassis 100, 120. Such interlocking facilitates alignment of power expansion unit 109. When a power expansion unit is added to chassis 100, 120, power backplane 208 is replaced by an extended power backplane that spans the added power expansion unit 109 and base unit 101. Any number of power expansion units can be added to chassis 100 to accommodate any number of power supply modules.

There is illustrated in FIG. 3 an exploded three-quarter view of shelf 105. Shelf 105 is circuit board housing designed to house plug-in modules 106 and fan module 102. Plug-in modules 106 are circuit cards (circuit boards) containing circuitry such as network interface controllers (NICs) which facilitate data communications. Shelf 105 contains two side sheets 301 and 302, card guides 303, 304, stabilizing plate 307 and ceiling 333. Ceiling 333 provides the mechanical rigidity and support necessary to provide strength to the side sheets 301 and 302 of shelf 105. The ceiling 333 also provides a mounting point for stabilizing plate 307. Card guides 303, 304 are attached to stabilizing plate 307 using flat-head screws and countersunk screw holes. Stabilizing plate 307 provides mechanical reference to align card guides 303, 304 with any installed backplanes. Card guides 303, 304 are also attached to ceiling 333. Ceiling 333 is attached to stabilizing plate 307 to provide additional stability to attached card guides 303, 304. Card guides 303, 304 align each plug-in module 106 as it is inserted into shelf 105. In the illustrated embodiment, card guides 303, 304 are pressed out of sheet metal and support two sides of each installed plug-in module 106. Card guides 303, 304 may be formed as a single piece as illustrated or may be formed as separate guides for each slot and may be made from a variety of materials. Stabilizing plate 307 is a rigid plate designed to hold a tight mechanical tolerance to provide the reference for the mechanical stability of shelf 105. In the illustrated embodiment, stabilizing plate 307 is a 0.25 inch thick machined aluminum plate. Stabilizing plate 307 is machined to provide a precise fit and reference for any attached components, in particular backplanes 205, 206 and 207, card guides 303, 304 and ceiling 333. This ensures a precise fit between backplane connectors 510, 520 (illustrated in FIG. 5B) and plug-in module connectors. Side sheets 301 and 302 are ventilated covers attached to ceiling 333. A rear protective cover typically made from sheet metal may be installed to provide electrical shielding to shelf 105 and to protect circuit modules 106 and backplanes 205, 206 and 207 from dust and other contaminants.

Figure 4:
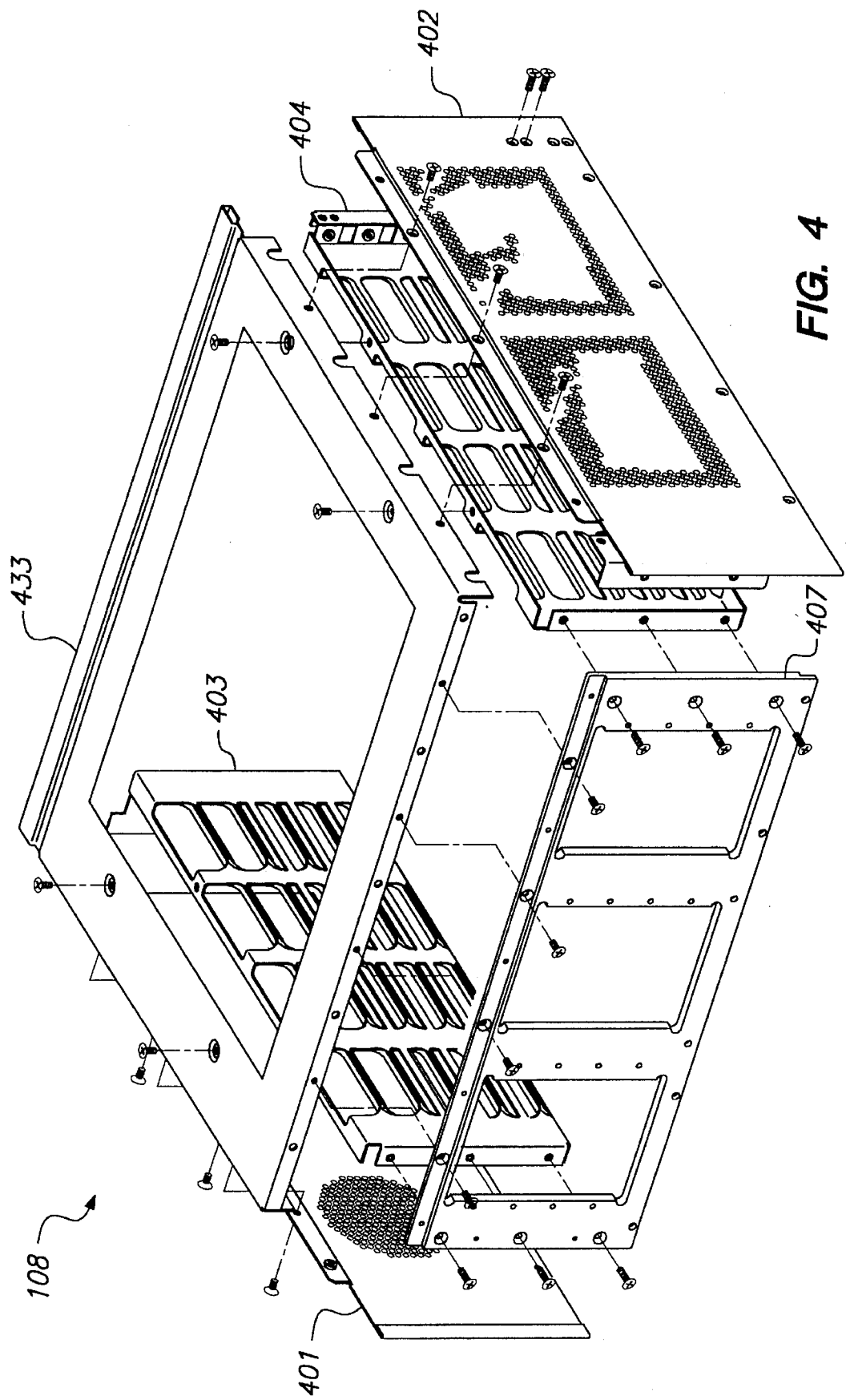
FIG. 4 is an exploded three-quarter perspective view of a central shelf in accordance with the present invention.

There is illustrated in FIG. 4 an exploded three-quarter view of central shelf 108. Central shelf 108 is a circuit board housing designed to house central plug-in modules 107 and fan module 102. Central shelf 108 contains two side sheets 401 and 402, card guides 403, 404, stabilizing plate 407 and ceiling 433. Card guides 403, 404 are attached to stabilizing plate 407 using flat-head screws. Stabilizing plate 407 provides mechanical reference to align card guides 403, 404 with any installed backplanes. Card guides 403, 404 are also attached to ceiling 433. Ceiling 433 is attached to stabilizing plate 407 to provide additional stability to attached card guides 403, 404. Card guides 403, 404 align each central plug-in module 107 or plug-in module 106 as it is inserted into central shelf 108. In the illustrated embodiment, card guides 403, 404 are pressed out of sheet metal and support two sides of each installed central plug-in module 107. Card guides 403, 404 may be formed as a single piece as illustrated or may be formed as separate guides for each slot and may be made from a variety of materials. Stabilizing plate 407 is a rigid plate designed to hold a tight mechanical tolerance to provide the reference for the mechanical stability of shelf 108. In the illustrated embodiment, stabilizing plate 407 is a 0.25 inch thick machined aluminum plate. Stabilizing plate 407 is machined to provide a precise fit and reference for any attached components, in particular backplanes 205, 206 and 207 and ceiling 433. This ensures a precise fit between backplane connectors 530, 531, 532 (illustrated in FIG. 5B) and central plug-in module connectors. Side sheets 401 and 402 are ventilated covers attached to ceiling 433. A rear protective cover typically made from sheet metal may be installed to provide electrical shielding to central shelf 108 and to protect central plug-in modules 107 and backplanes 205, 206 and 207 from dust and other contaminants.

Figure 5A:
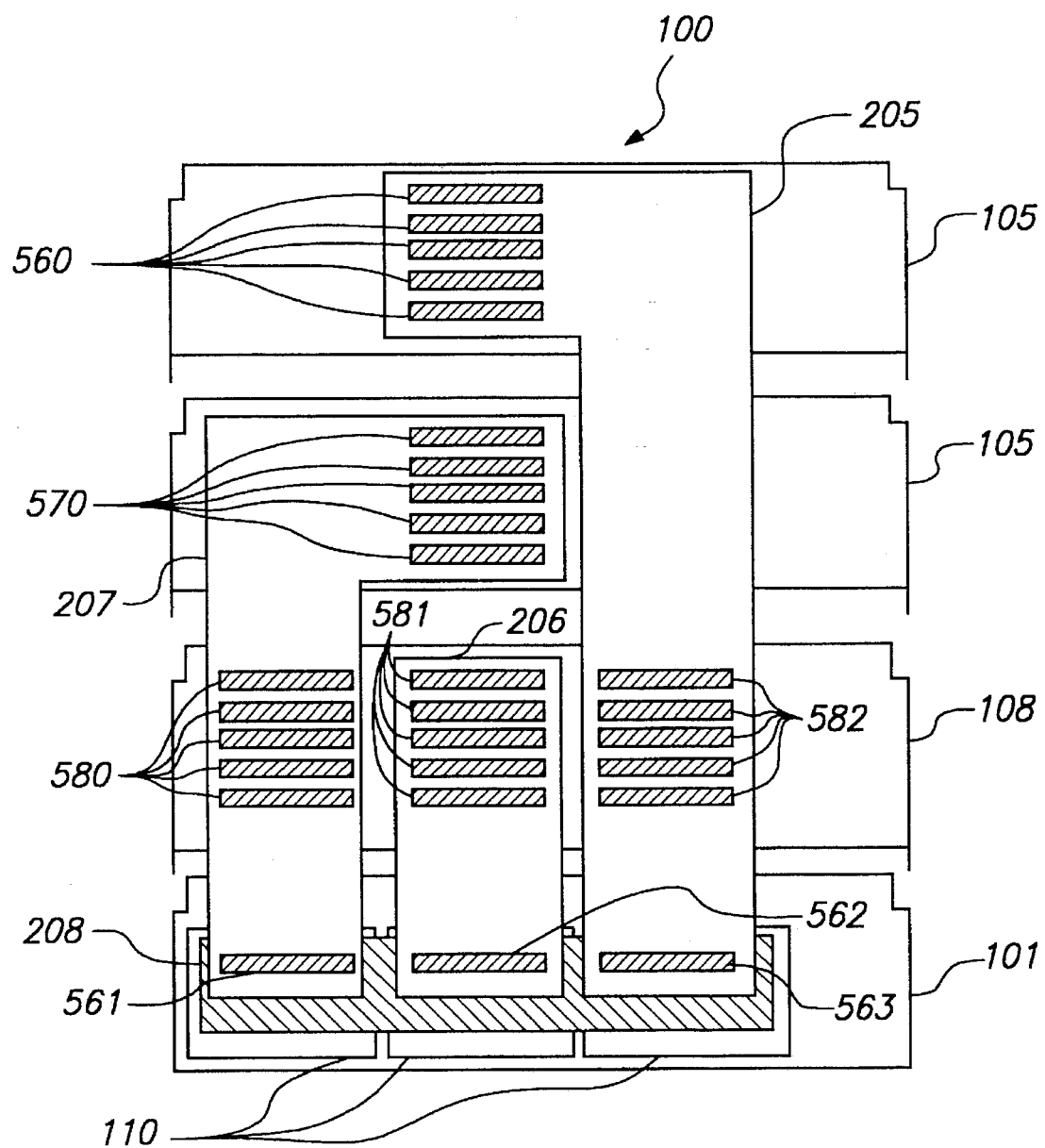
FIG. 5A is a back view of an expandable data processing chassis in accordance with the present invention.

There is illustrated in FIG. 5A a back view of an expandable data processing chassis 100 in accordance with the present invention. Expandable processing chassis 100 contains base unit 101, shelves 105, central shelf 108, power backplane 208 and backplanes 205, 206 and 207. In the illustrated embodiment, central shelf 108 houses one or more central or "common" processing plug-in modules 107 to arbitrate and facilitate communication between plug-in circuit modules 106 of each shelf 105 and any communications network to which expandable processing chassis 100 is attached. It should be noted that in the illustrated embodiment, central shelf 108 can house plug-in modules 106 in addition central plug-in modules 107. The backplane configuration of the present invention facilitates the transmission of electrical signals, including power signals, data signals and control signals between plug-in modules 106 of various shelves 105, base unit 101 and central shelf 108. Backplanes 205 and 207 each directly couple plug-in modules 106 and central plug-in modules 108. Because plug-in modules 106 and central plug-in modules 107 are directly coupled by a single backplane, for example either backplane 205 or backplane 207, high-speed data signals are transferred with minimal signal degradation and transmission-line effects.

FIG. 5A shows a back view of backplanes 205, 106, 207 and therefore, the connectors on the front of backplanes 205, 206, 207 are not visible. Thus, FIG. 5A indicates connector positions corresponding to connectors mounted on the front of backplanes 205, 206, 207. Connector positions 560, 570, 580, 581, 582, 561, 562 and 563 indicate the location of backplane connectors on the front of backplanes 205, 206, 207.

Figure 5B:
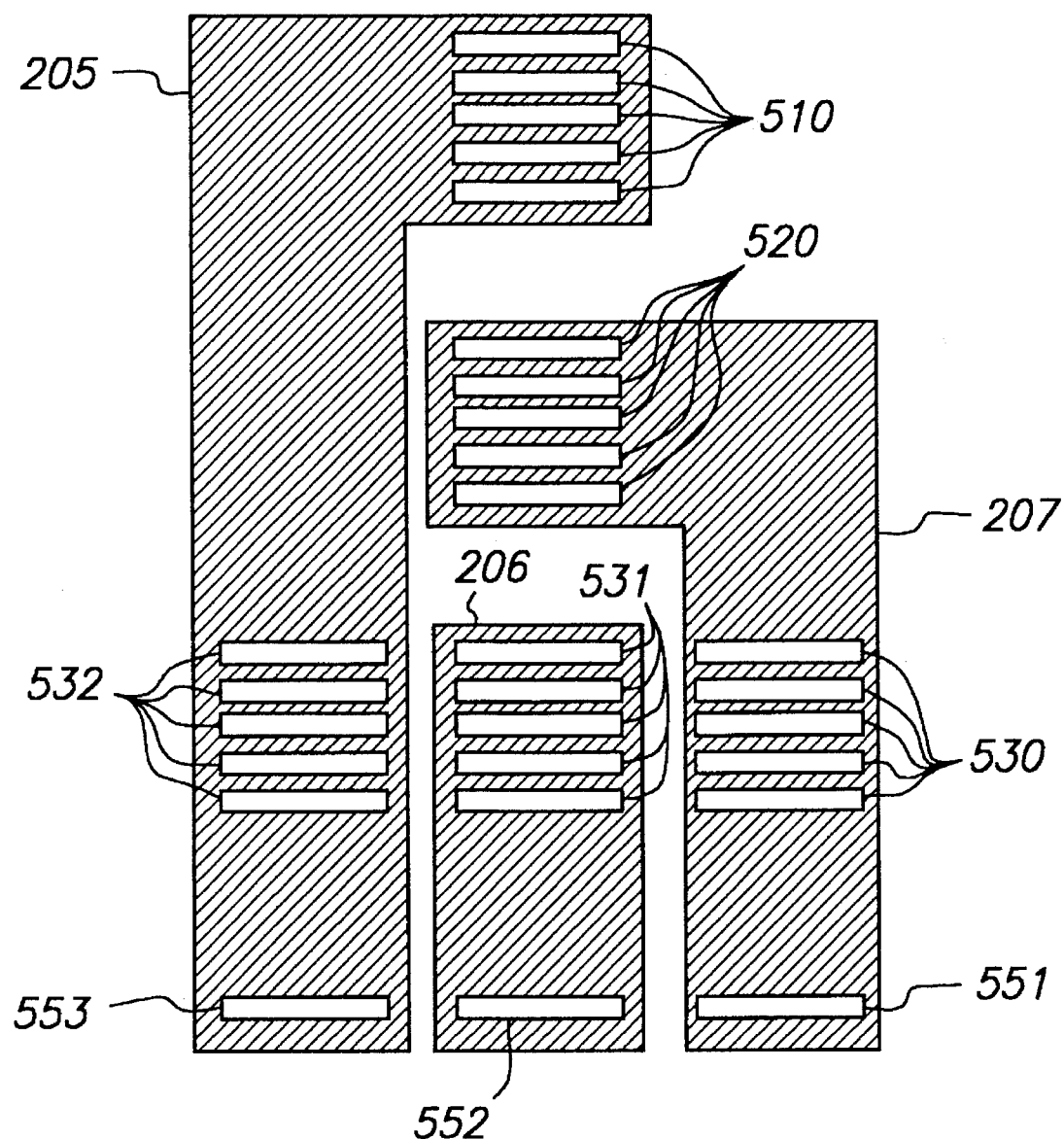
FIG. 5B illustrates a front view of modular backplanes in accordance with the present invention.

There is illustrated in FIG. 5B a front view of modular backplanes 205, 206 and 207 in accordance with the present invention. Backplane 205 is a planar backplane, typically a printed circuit board and is mounted to stabilizing plate 307 of shelf 105. Backplane 205 has three sets of electrical connectors and electrically conductive paths to electrically couple the sets of connectors as well as the connectors within each set. The first set of electrical connectors contains five electrical connectors 510 for coupling to complementary connectors on plug-in circuit modules 106. Thus, electrical connectors 510 couple to plug-in modules 106 received in shelf 105. Electrical connectors 510 correspond to positions 560. The second set of electrical connectors contains five electrical connectors 532 for coupling to complementary connectors on central plug-in modules 107. Thus, electrical connectors 532 couple to central plug-in modules (common cards) 107 received in central shelf 108. Electrical connectors 532 correspond to positions 582. The third set of electrical connectors contains one electrical connector 553 for coupling to power backplane 208 of base unit 101 via power backplane connector 253. Electrical connector 553 corresponds to position 563. By having first and second sets of electrical connectors 510, 532, backplane 205 provides a direct electrical connection between plug-in modules 106 and central plug-in modules 107. Such direct electrical connection reduces unwanted transmission-line effects and signal degradation introduced by impedance mismatch.

Similarly, backplane 207 is a planar backplane, typically a printed circuit board and is mounted to a shelf 105. Backplane 207 also has three sets of electrical connectors and has electrically conductive paths to electrically couple the sets of connectors as well as the connectors within each set. The first set of electrical connectors contains five electrical connectors 520 for coupling to plug-in circuit modules 106 received in shelves 105. Electrical connectors 520 correspond to positions 570. The second set of electrical connectors contains five electrical connectors 530 for coupling to central plug-in modules 107 received in central shelf 108. Electrical connectors 530 correspond to positions 580. The third set of electrical connectors contains one electrical connector 551 for coupling to power backplane 208 of base unit 101 via power backplane connector 253. Electrical connector 551 corresponds to positions 561. Electrical connectors 520, 530 of backplane 207 provide a direct electrical connection between plug-in modules 106 and central plug-in modules 107 and thereby reduce unwanted transmission-line effects and noise arising from impedance mismatch. Backplane 206 is a planar backplane, typically a printed circuit board and is mounted to a shelf 105.

Backplane 206 is a planar circuit board backplane for distributing electrical signals between the various central plug-in modules 107 received in central shelf 108. Backplane 206 additionally extends to and couples to power backplane 208 for receiving power signals via electrical connectors 552 and power backplane connector 252. Backplane 206 has two sets of electrical connectors. The first set of electrical connectors contains five electrical connectors 531 for coupling to central plug-in circuit modules 107 received in shelf 108. Electrical connectors 531 correspond to positions 581. The second set of electrical connectors contains one electrical connector 552 for coupling to power backplane 208 of base unit 101 via power backplane connector 252. Electrical connector 552 corresponds to position 562. It should be noted that backplanes in accordance with the present invention can have sets of electrical connectors having a different number of connectors than is shown on the illustrated embodiment.

Each circuit module 106 has an electrical connector designed to mate with (complementary to) electrical connectors 510, 520. It should be noted that connectors 531 associated with central shelf 108 may also be designed to mate with plug-in circuit module connectors so that plug-in modules 106 may be received in central shelf 108. In the illustrated embodiment, the electrical connectors 510, 520 are located on backplanes 205, 207 such that the connectors are vertically aligned in a fixed horizontal position. Vertically aligned in a fixed horizontal position means that the electrical connectors 510 are positioned one above the other (vertically aligned) in a location that is fixed in the horizontal direction with respect to shelf 105 when backplane 205 is mounted to shelf 105. Similarly, electrical connectors 520 are positioned one above the other (vertically aligned) in a location that is fixed in the horizontal direction with respect to shelf 105 when backplane 207 is mounted to shelf 105. Such fixed horizontal locations define "spatial locations", for example a horizontal location relative to shelf 105. Because connectors 510 and 520 are vertically aligned in a fixed horizontal position, shelf 105 along with coupled backplane 205 is able to receive circuit modules 106 each having a uniform form factor. A uniform form factor means that each circuit module 106 has substantially the same shape with a connector in substantially the same location. Similarly, shelf 105 along with coupled backplane 207 is able to receive circuit modules 106 each having a uniform form factor.

Referring again to FIGS. 5A, 5B in the illustrated embodiment, backplanes 205, 207 have an inverted "L" shape which extends from an associated shelf 105 across central shelf 108 and down to base unit 101. The inverted "L" shape positions the sets of electrical connectors 510, 520 in substantially the same fixed horizontal location relative to shelves 105. Such positioning enables each shelf 105 to receive plug-in circuit modules having substantially the same form factor. For example, the location of any electrical connector of a plug-in circuit module 106 is in substantially the same location on all plug-in circuit modules 106. Not only does such positioning enable shelves 105 to receive different types of plug-in modules having the same form factor, but also, a single plug-in circuit module may be received or "plugged-in" to any plug-in module location in any of the shelves 105.

Figure 5C:
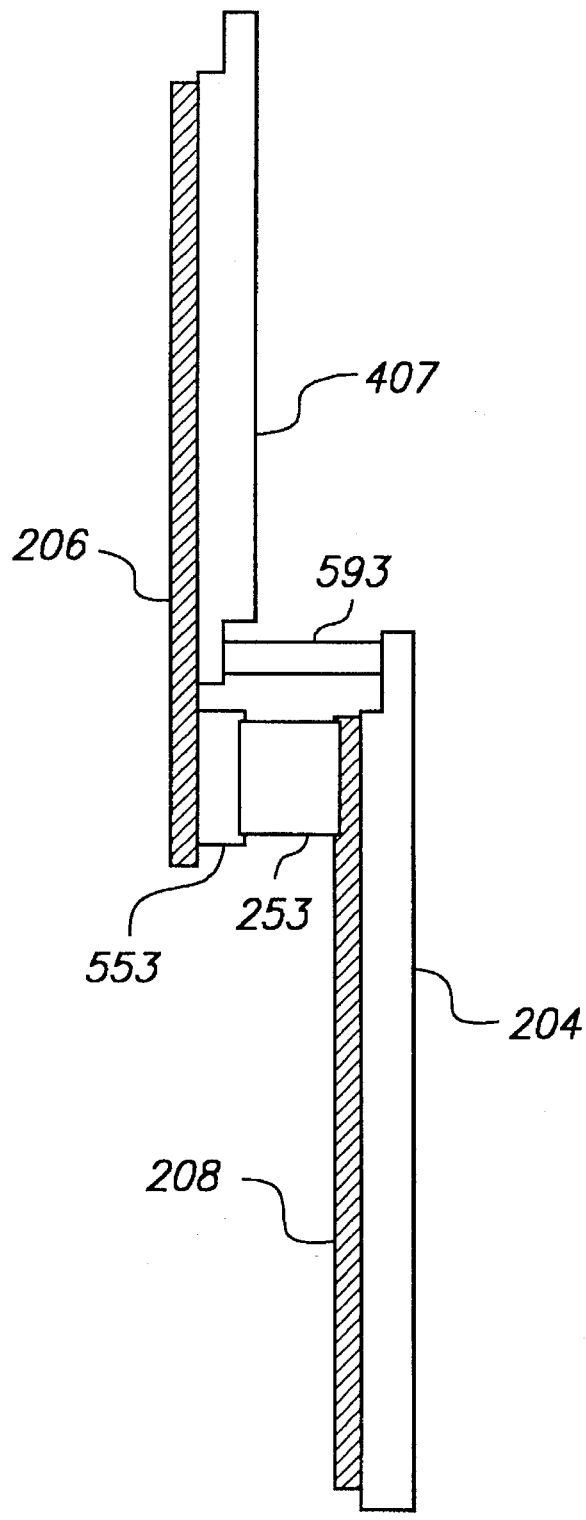
FIG. 5C is a side view of a power backplane and shelf backplane connection in accordance with the present invention.

There is illustrated in FIG. 5C, a side view of a power backplane 208 and shelf backplane 206 connection in accordance with the present invention. Standoff 593 mounts to stabilizing plates 407 and 204 and fixes their spatial relationship. Stand-off 593 has a length that facilitates the connection of power backplane connector 253 to backplane connector 553.

Figure 6:
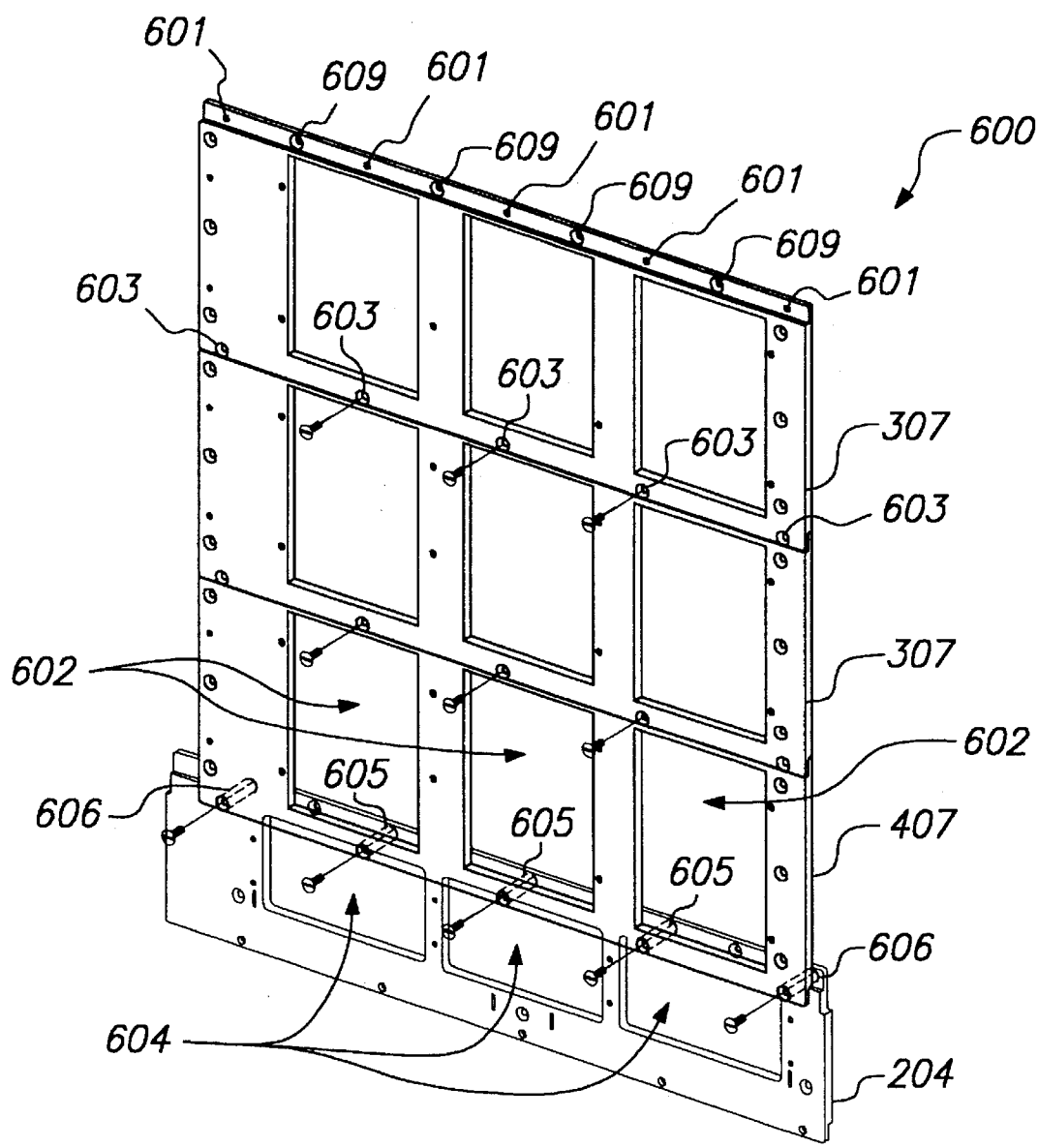
FIG. 6 illustrates interlocking stabilizing frame plates in accordance with the present invention.

There is illustrated in FIG. 6 interlocking stabilizing plates 204, 307, 407 in accordance with the present invention. Shelf stabilizing plates 307, central shelf stabilizing plate 407 and base unit stabilizing plate 204 are coupled together to form a rigid interlocking frame 600 to provide stability to expandable processing chassis 100 and to enable expandable chassis 100 to hold mechanical tolerances during assembly. For example, as each shelf 105 is added to expandable chassis 100, stabilizing plates 204, 307, 407 provide the mechanical reference to properly position any added shelves 105. Proper positioning of each added shelf allows the addition of a single inverted "L" shaped backplane for coupling plug-in modules 106 of added shelf 105 to central plug-in modules 107 of central shelf 108 and to power backplane 208 of base unit 101.

Stabilizing plates 307, 407 have three windows or openings 602 to accommodate any connectors of plug-in modules 106, 107 as well as any connectors on backplanes 205, 206, 207 which are attached to stabilizing plates 307, 407.

Figure 7:
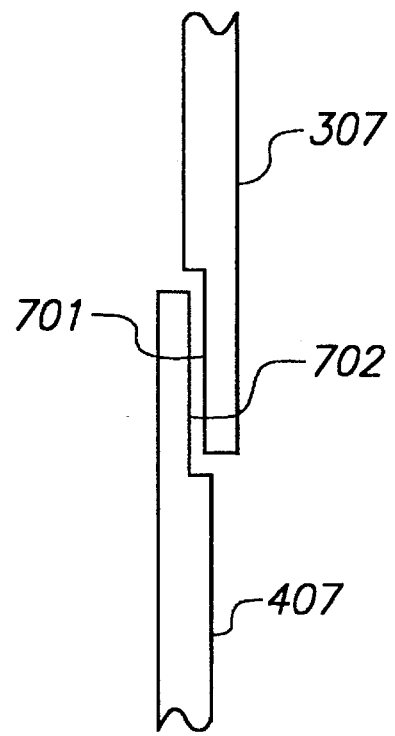
FIG. 7 is a side view of interlocking stabilizing frame plates in accordance with the present invention.

In the illustrated embodiment, shelf stabilizing plates 307 and central shelf stabilizing plate 407 are substantially the same. Plates 307 and 407 are machined from aluminum and have a thickness of 0.25 inches to provide rigidity to expandable chassis 100. It should be noted that stabilizing plates made from other materials and having other thickness could also provide sufficient rigidity. Each frame plate 307, 407 has five drilled, tapped screw holes 601 along the top edge and five drilled, countersunk screw holes 603 in corresponding positions along the bottom edge. Now referring to FIG. 7 which illustrates a side view of interlocking stabilizing plates, each interlocking stabilizing plate 307, 407 has a recessed edge 701, 702. Recessed edges 701, 702 run along the edges of plates 307, 407 having holes 601, 603. Recessed edges 701, 702 allow stabilizing plates 307, 407 to interlock when flat-head screws are used through screw holes 601, 603 to secure stabilizing plates 307, 407. Each frame plate 307, 407 also has four drilled, countersunk screw holes 609 along the top edge. Flat-head screws are used through screw holes 609 to secure and align ceiling 333, 433. Another frame plate can be attached to the top of an existing frame plate 307, 407 after the ceiling has been secured to the existing frame plate using screw holes 609.

Referring again to FIG. 6, base unit stabilizing plate 204 is machined from aluminum and has a thickness of 0.25 inches to provide rigidity to chassis 100. It should be noted that frame plates made from other materials and having other thickness could also provide sufficient rigidity. Base unit stabilizing plate 204 has five drilled, countersunk screw holes 605 along the top edge. Stabilizing plate 204 mounts to stabilizing plate 407 using stand-offs 606 associated with each hole 605 to fix the relationship between the plates 204, 407. Base unit stabilizing plate 204 has three windows or openings 604 to accommodate any connectors of power supplies 201 as well as any connectors on backplane 208 which is attached to stabilizing plate 204.

Shelf stabilizing plates 307, central shelf stabilizing plate 407 and base unit stabilizing plate 204 when screwed together provide a rigid frame 600 to which backplanes 205, 206, 207, 208 are attached.

Expandable chassis 100 is expanded by adding a shelf 105 and an associated "L" shaped backplane to chassis 100. Because each shelf 105 has a stabilizing plate 307, the addition of a shelf to expandable chassis 100 includes the addition of a stabilizing plate 307 to rigid frame 600 thereby maintaining the mechanical tolerances, rigidity and stability of chassis 100. Because mechanical tolerances are maintained as each shelf is added to expandable chassis 100, the extended "L" shaped backplanes which require precise chassis alignment may also be added to electrically couple the added shelf to central shelf 108 and base unit 101.

Second Embodiment

Figure 8:
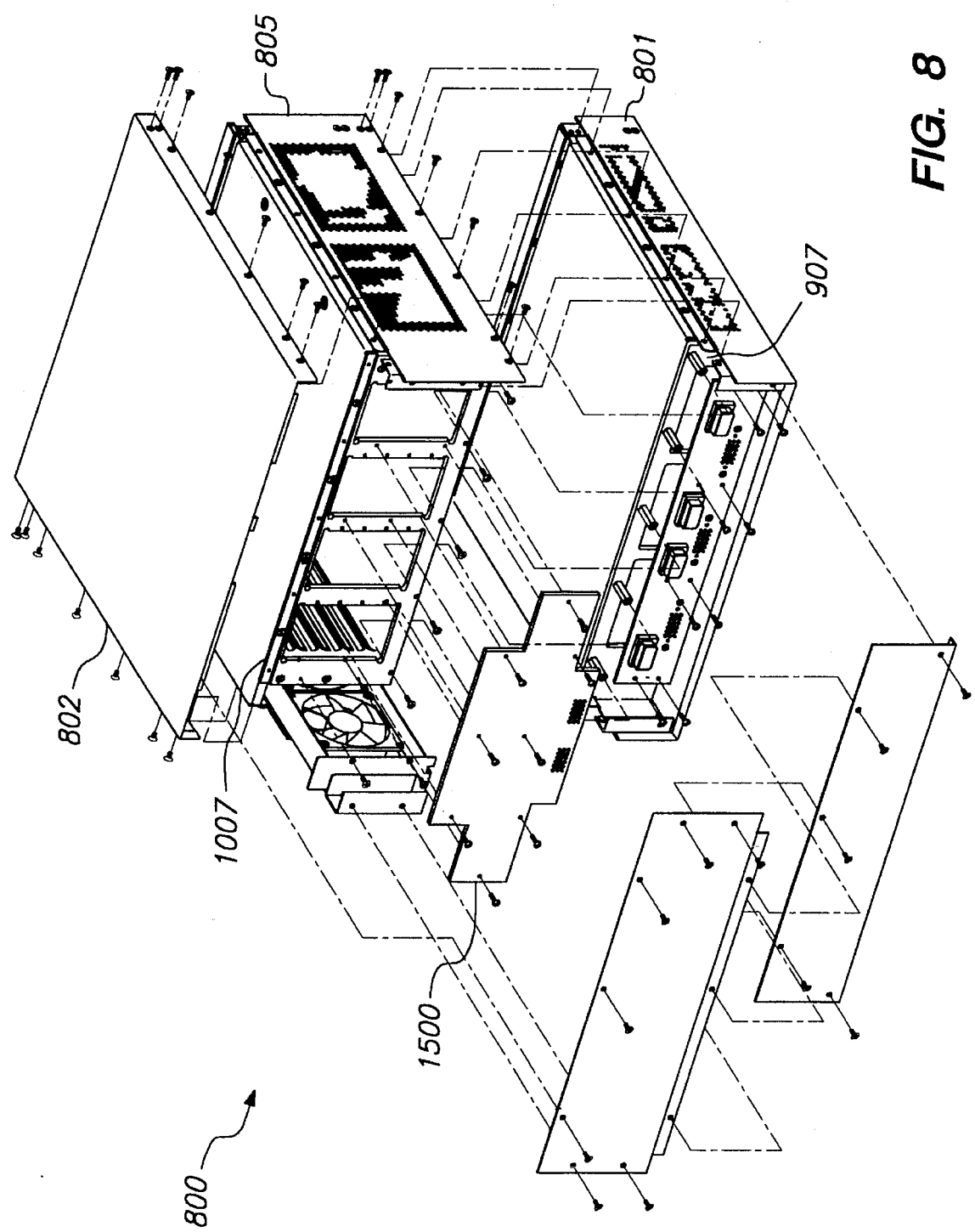
FIG. 8 is an exploded three-quarter perspective view of an expandable data processing chassis in accordance with the present invention.

There is illustrated in FIG. 8 a second embodiment of an expandable data processing chassis 800 in accordance with the present invention. Chassis 800 has a base unit 801, one or more shelves 805, modular backplane 1500 and a top cover section 802. Chassis 800 may also contain any number of optional power expansion units 900 (illustrated in FIG. 10). Expandable chassis 800 facilities the construction of a family of configurations having a varying number of stackable shelves 805 and power expansion units 900 and which accommodates various backplane types and configurations. Using a small set of mechanical components and backplanes, this family of configurations accommodates a wide variety of applications requiring different numbers of shelves 805, plug-in circuit modules and backplane configurations. Expandable chassis 800 can additionally accommodate configurations requiring a different number of plug-in modules per bus. Additional features and advantages of chassis 800 will become evident from the description that follows.

Figure 9:
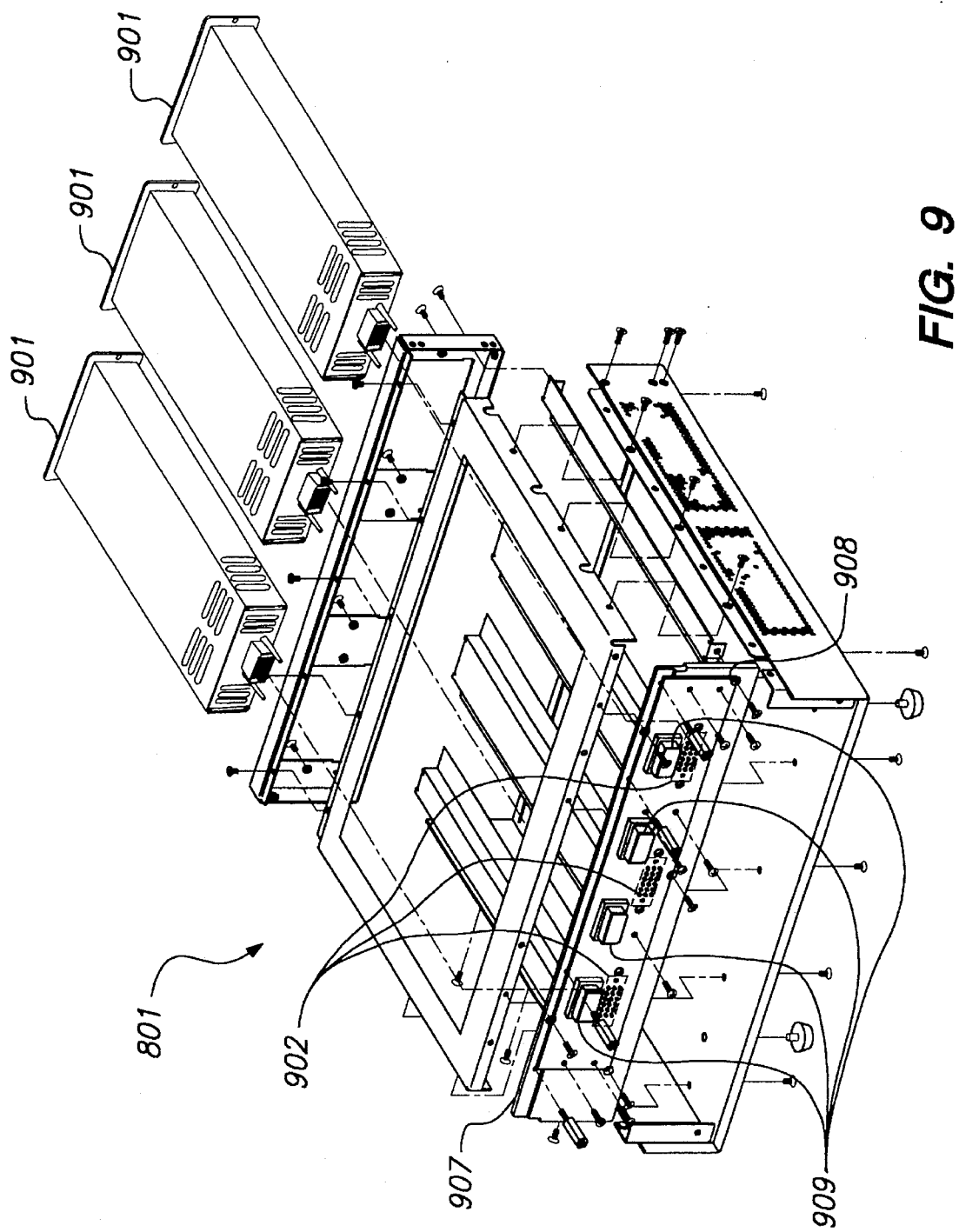
FIG. 9 is an exploded three-quarter perspective view of a base unit in accordance with the present invention.

There is illustrated in FIG. 9, base unit 801 in accordance with the present invention. Base unit 801 is similar to base unit 101 of expandable chassis 100 and also receives up to three removable power supply modules 901. Base unit 801 has a power backplane 908 which spans the rear of base unit 908. Power backplane 908 has power connectors 902 for receiving mating connectors on power supplies 901. Power backplane 908 additionally has four power backplane connectors 909 to which mating connectors on modular backplanes or cables connect.

Figure 10:
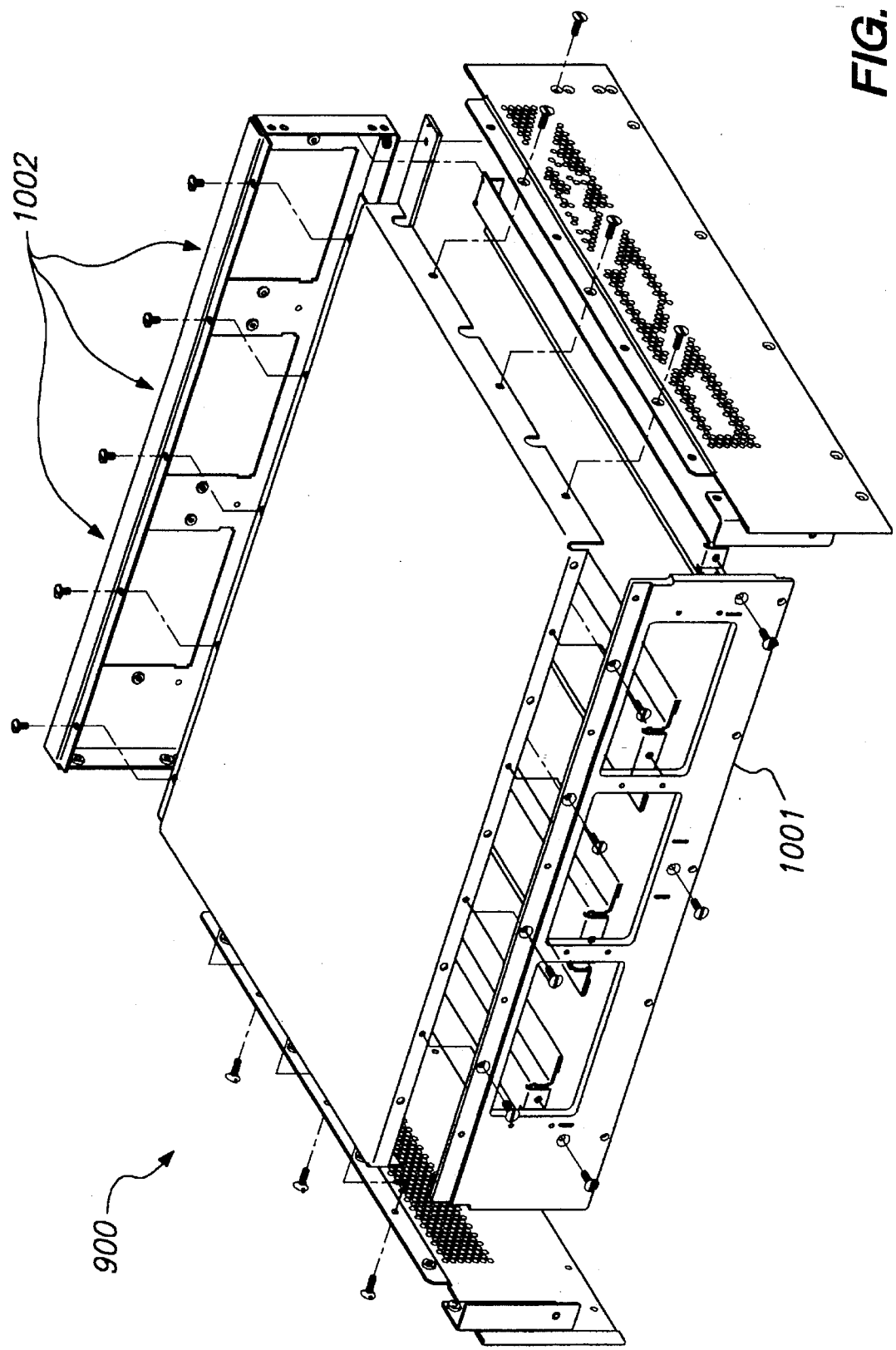
FIG. 10 is an exploded three-quarter perspective view of a power expansion unit in accordance with the present invention.

There is illustrated in FIG. 10 power expansion unit 900 in accordance with the present invention. Power expansion unit 900 can optionally be added to expandable chassis 800. Power expansion unit 900 has a stabilizing frame plate 1001 and three bays 1002 for receiving additional power supplies. Stabilizing frame plate 1001 is formed from a rigid material such as 0.25 inch thick aluminum and is machined to achieve precise mechanical tolerances. Stabilizing frame plate 1001 is used to mount an added power supply expansion unit 900 to a base unit 801 or to another power expansion unit 900 already configured in chassis 800. Stabilizing plate 1001 has a machined lip to interlock with an adjacent plate (either stabilizing plate 907 of a base unit or stabilizing plate 1001 of another power expansion unit) upon addition to chassis 900. Such interlocking facilitates alignment of expansion power unit 900. When an expansion power unit is added to chassis 800, power backplane 908 is replaced by an extended power backplane that will span the added power expansion unit 900 as well as the base unit 801 and any power expansion units already installed.

Figure 11:
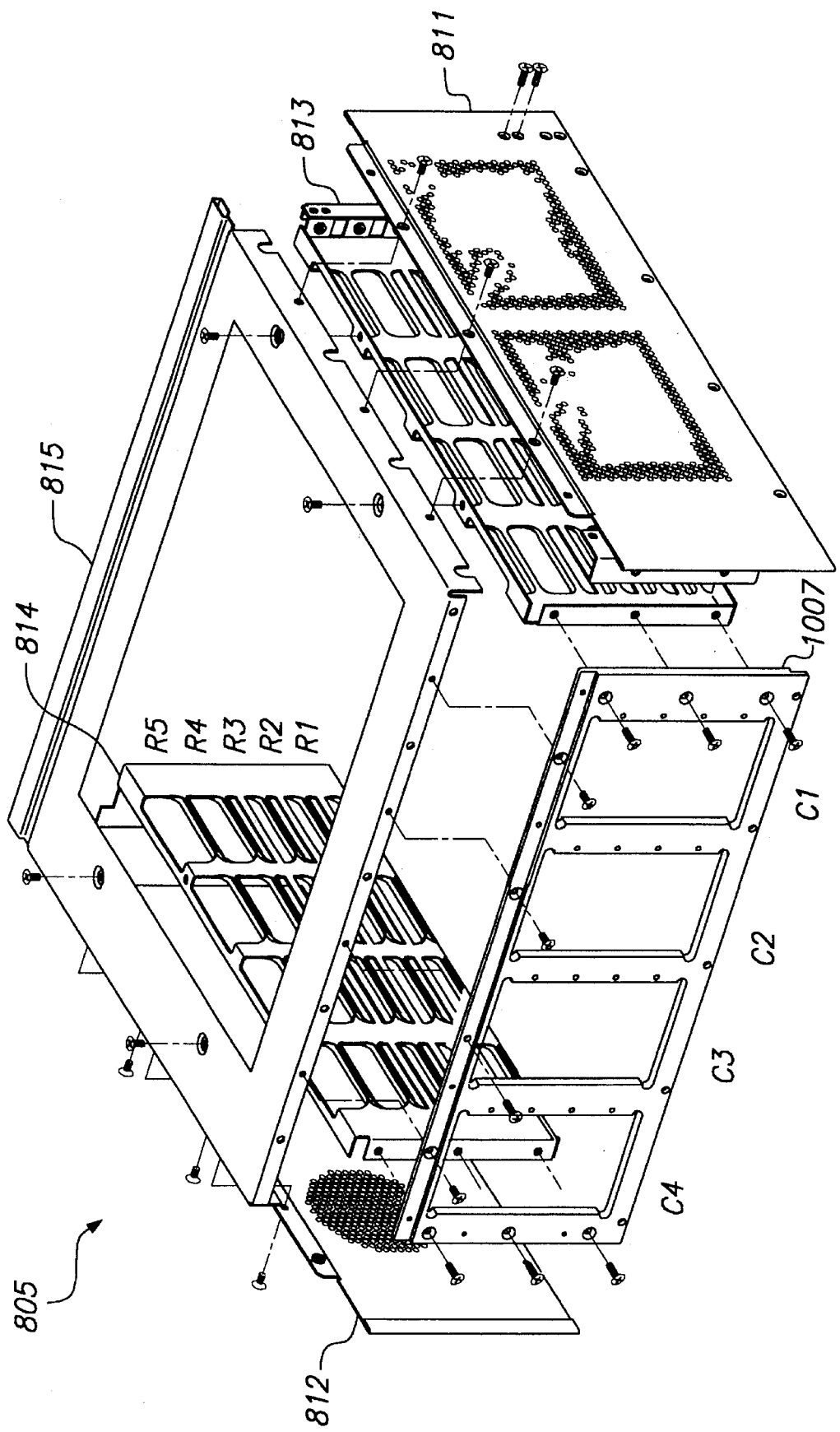
FIG. 11 is an exploded three-quarter perspective view of a shelf in accordance with the present invention.

There is illustrated in FIG. 11 a shelf 805 in accordance with the present invention. Shelf 805 is similar to shelf 105 of expandable chassis 100, 120. Shelf 805 contains two side sheets 811 and 812, card guides 813, 814, stabilizing plate 1007 and ceiling 815. Card guides 813, 814 are attached to stabilizing plate 1007 using flat-head screws and countersunk screw holes. Stabilizing plate 1007 provides mechanical reference to align card guides 813, 814 with any installed backplanes. Card guides 813, 814 are also attached to ceiling 815. Ceiling 815 is attached to stabilizing plate 1007 to provide additional stability to attached card guides 813, 814. Card guides 813, 814 align each circuit module inserted into shelf 805. Stabilizing plate 1007 of shelf 805, however has four, rather than three, cutouts or openings through which plug-in module connectors and/or backplane connectors can protrude. The four cutouts in stabilizing plate 1007 correspond to the four fixed horizontal positions, or columns C1, C2, C3, C4. Shelf 805 receives plug-in modules 1300a, 1300b and central plug-in modules 1200 (illustrated in FIGS. 12 and 13) in any one of five slots defined by card guides 813, 814. Each slot corresponds to a row. A one shelf chassis has five rows R1–R5. A two shelf chassis has ten rows R1–R10. A three shelf chassis has fifteen rows R1–R15. A four shelf chassis has twenty rows R1–R20.

Figure 12:
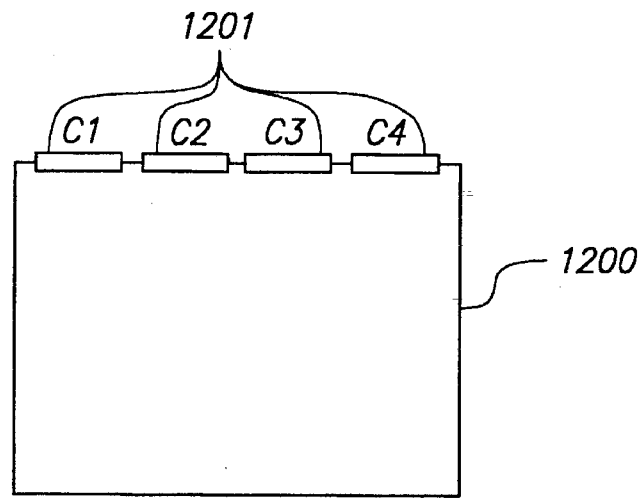
FIG. 12 is a central plug-in module in accordance with the present invention.
Figure 13A:
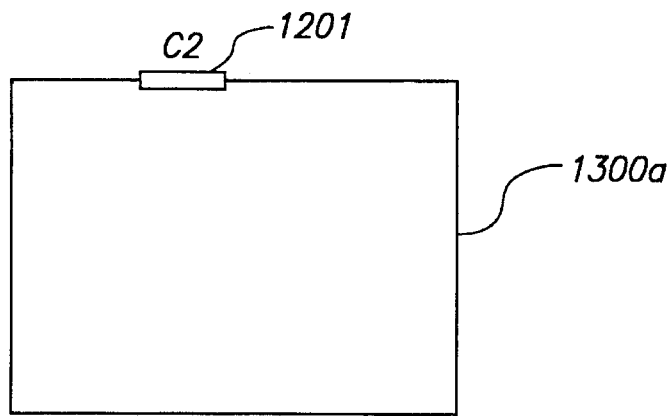
FIG. 13A is a plug-in module in accordance with the present invention.
Figure 13B:
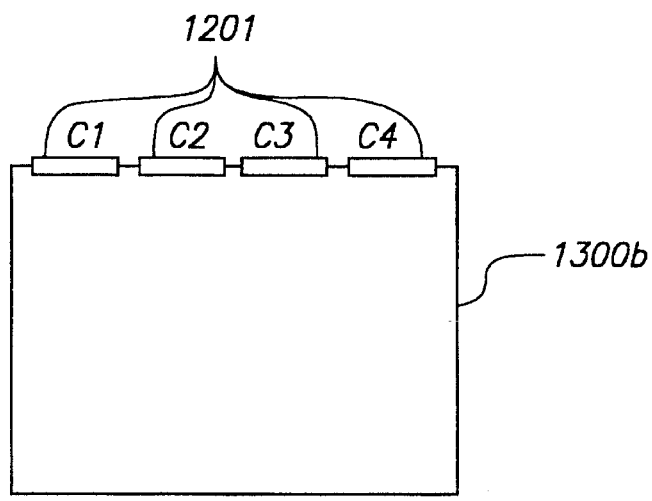
FIG. 13B is a plug-in module in accordance with the present invention.

There is illustrated in FIGS. 12, 13A and 13B central plug-in module 1200 and plug-in modules (non-central plug-in modules) 1300a, 1300b. Expandable chassis 800 receives plug-in modules 1300a, 1300b and central plug-in modules 1200 in shelves 805. Plug-in modules 1300 and central plug-in modules 1200 are circuit boards (circuit cards) having communications or other types of electronic circuitry. In the illustrated embodiment, central plug-in module 1200 is a packet engine module for forwarding data packets to plug-in modules 1300a, 1300b and for arbitrating bus traffic. Shelves 805 receive up to five plug-in modules 1300a, 1300b, 1200 in any one of five plug-in module locations or slots which correspond to rows R1–R5; on a first shelf, rows R6–R10 on a second shelf, rows R11–R15 on a third shelf and rows R16–R20 on a fourth shelf. In the illustrated embodiment slots in rows R4 and R5, or R9 and R10, are central module slots for receiving central plug-in modules 1200.

A bus has a plurality of electrically conductive paths which couples at least one pin on a first connector to at least one pin on a second connector. A central bus is a bus which couples to a connector positioned to receive a central plug-in module.

Referring now to FIG. 12, central plug-in module 1200 has four central buses and four electrical connectors 1201. Each connector 1201 is aligned in one of four horizontal connector positions (columns) C1, C2, C3, and C4. Although central plug-in module 1200 as illustrated has four electrical connectors 1201, a central plug in module can alternatively have only one, two or three connectors. Whether central plug-in module 1200 has one, two, three or four connectors 1201 depends on the configuration and requirements of the data processing system. A central plug-in module may have more connectors than required for a specific data processing application. For example, central plug-in module 1200 in a particular application may be required to connect to only two central buses on a backplane. In such a case, the connectors 1201 corresponding to the unneeded central bus locations, for example locations corresponding to columns C1 and C4, need not be installed, and the corresponding circuitry on the central plug-in module 1200 may be omitted to provide cost savings, However, if the unneeded connectors 1201 and circuitry are still provided on the central plug-in module 1200, they will simply go unused. Such unneeded connectors 1201 will poke through shelf stabilizing plate 1007 but will encounter no corresponding backplane connectors with which to mate. Each connector 1201 which mates with a corresponding complementary backplane connector 1401 is coupled to a bus and carries the electrical signals associated with that bus.

In accordance with the present invention, plug-in modules 1300a, 1300b have one or more connectors 1201. The illustrated embodiments show plug-in module 1300a having a single connector 1201 and plug-in module 1300b having four connectors 1201. The principles of the present invention, however apply to a plug-in module having any number of connectors 1201.

There is illustrated in FIG. 13A a connector arrangement of plug-in module 1300a in accordance with the present invention. Plug-in module 1300a is a plug-in module having a single connector 1201 positioned to correspond to column C2. When inserted into a slot in shelf 805, plug-in module connector 1201 couples to a backplane bus corresponding to column C2 and the slot row (for example any one of rows R1–R20). In accordance with the illustrated embodiment, when plug-in modules 1300a are inserted into chassis 800, connectors 1201 positioned in column C2 are coupled to central data buses for coupling to (communication with) central plug-in modules 1200.

There is illustrated in FIG. 13B a connector arrangement of plug-in module 1300b in accordance with the present invention. Plug-in module 1300b is a plug-in module having a four connectors 1201 in columns C1, C2, C3, and C4. When inserted into a slot in shelf 805, plug-in module connectors 1201 couple to any corresponding backplane connectors 1401 to couple plug-in module 1300b to associated buses. In accordance with the illustrated embodiment, when plug-in modules 1300b are inserted into chassis 800, connectors 1201 positioned in column C2 are coupled to central data buses for coupling to (communication with) central plug-in modules 1200, and connectors 1201 positioned in columns C1, C3 and C4 are coupled to private buses for coupling to (communication with) other plug-in modules.

There is illustrated in FIGS. 14–20 modular backplanes 1400, 1500, 1600, 1700, 1800, 1900, 2000 which are used in various configurations of chassis 800. Each modular backplane has a specified shape, two or more backplane connectors 1401 and at least one central bus 1501–1514. Modular backplanes 1500, 1600, 1700, 1800, 1900, 2000 additionally have at least one private bus 1601–16115. In the illustrated embodiments, backplane connectors 1401 are positioned to align in any of four fixed horizontal positions, or columns C1, C2, C3, C4 and in any one of 20 rows R1–R20 wherein the columns and rows are defined relative to chassis 800. Thus, each backplane connector position is designated by a column and row designation, for example position (C2, R5).

Central buses 1501–1514 are buses electrically coupled to backplane connectors positioned to receive a central plug-in module. In the illustrated embodiments, either row R15 (in the case of backplanes 1400, 2000), rows R4 and R15 (in the case of backplanes 1500, 1600, 1700) or rows R9 and R10 (in the case of backplanes 1800 and 1900) correspond to slots adapted to receive central plug-in modules 1200. Thus, any buses coupled to connectors positioned in these rows (central plug-in module rows) are central buses coupling to any installed central plug-in modules 1200. Additionally, each central bus 11501–11514 couples to a connector positioned in column C2 so that each central bus also couples to any plug-in modules 1300a, 1300b installed in a non-central row. In the illustrated embodiments, central buses are packet channels for sending data packets, cells or other data between central plug-in module 1200 and a plug-in module 1300a, 1300b.

Private buses 1601–1615 electrically couple connectors positioned within the same column for electrically coupling any plug-in modules received in the corresponding slots. Private buses 1601–1615 allow private communications among plug-in modules 1300b as might be required when such modules are installed as a set adapted for a particular application-specific purpose, such as a repeater, concentrator or switch for a set of related network connections.

As previously discussed, expandable chassis 800 can be reconfigured to create a family of different configurations for different data processing system applications. Each configuration has a modular backplane comprising one or more backplanes, for example a bottom backplane and an expansion backplane. Several modular backplanes in accordance with the present invention are illustrated in reference to expandable chassis 800.

Figure 14:
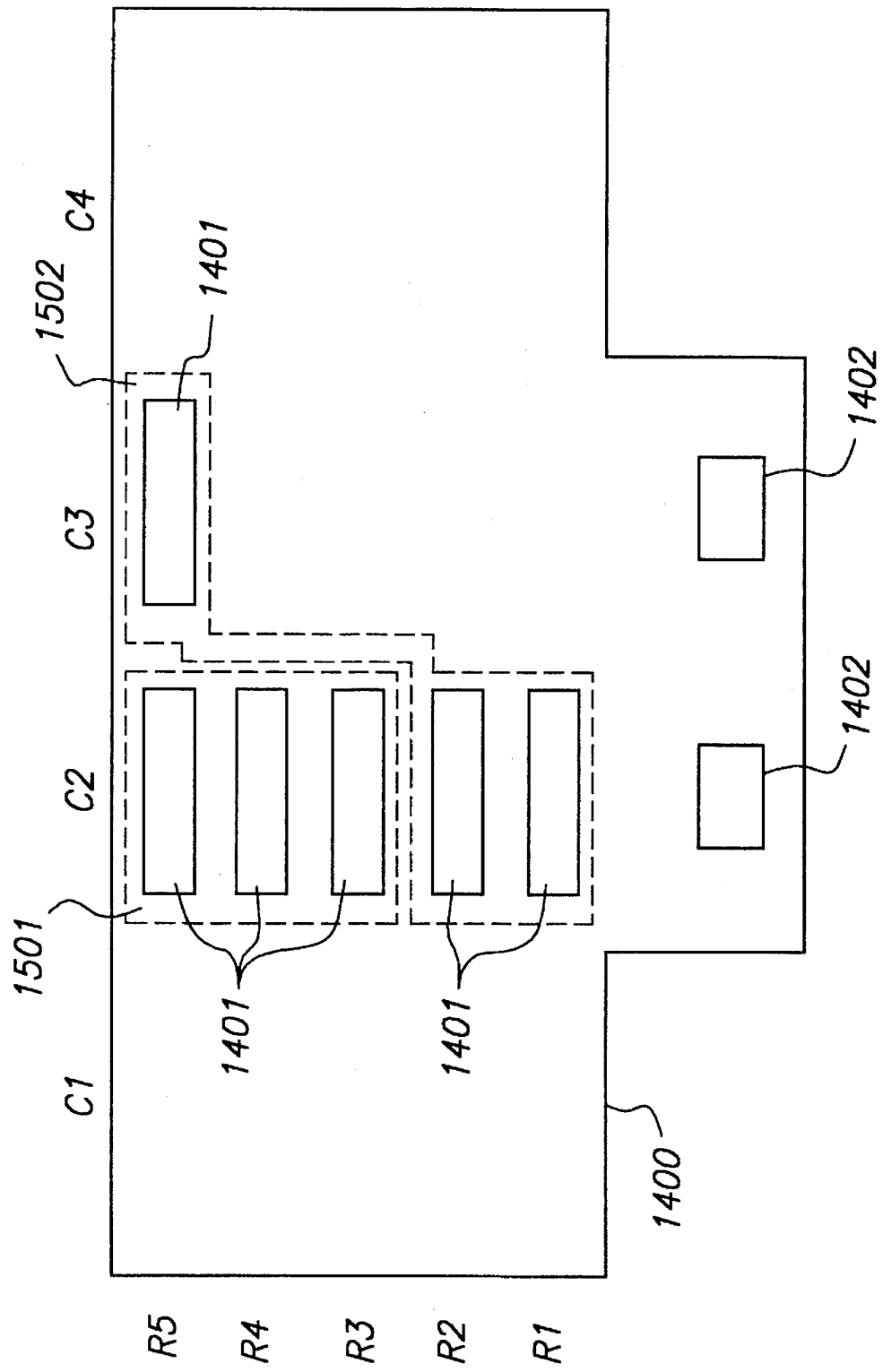
FIG. 14 is a front view of a bottom backplane in accordance with the present invention.

Now referring to FIG. 14, a front view of backplane 1400 in accordance with the present invention is illustrated. Backplane 1400 is a bottom backplane and may be used when expandable chassis 800 is configured with only one shelf 805. Backplane 1400 has two power connectors 1402 and six backplane connectors 1401 positioned in five connector rows R1–R5 corresponding to the five plug-in module slots of shelf 805. The bottom of backplane 1400 has an extended portion on which two power connectors 1402 are mounted on the back side. The extended shape allows the power backplane connectors 1402 to mate with power connectors 909 on a power backplane 908. Backplane 1400 additionally has two central buses 1501, 1502. Bus 1501 electrically couples backplane connectors in positions (C2, R5), (C2, R4) and (C2, R3). Bus 1502 electrically couples backplane connectors in positions (C2, R2) and (C2, R1) to (C3, R5). In accordance with this configuration, central plug-module 1200 is received in a slot corresponding to row R5 and plug-in modules 1300a, 1300b are inserted in any slots corresponding to rows R1–R4. When inserted, central plug-in module 1200 is electrically coupled to buses 1501 and 1502 and is therefore coupled to any plug-in module 1300a, 1300b received in rows R1, R2, R3 and R4. Such a configuration facilitates communication between central plug-in modules 200 and plug-in modules 1300a, 1300b.

The bus configuration and connector positioning of backplane 1400 advantageously provides flexibility with respect to which slots are configured with plug-in modules 1300a, 1300b. For example, a plug-in module 1300a, 1300b may be installed in any of the available slot positions 111 through 114, and will communicate with (is coupled to) any central plug-in module 1200 received in slot position R5 using either bus 1501 or 1502. Thus, central plug-in module 1200 uses multiple buses 1501 and 1502, each of which communicates with (is coupled to) only a subset of plug-in modules 1300a, 1300b. The positioning of connectors 1401, such that the connectors in rows R1–R4 are vertically aligned in a fixed horizontal position (column C2) allow for plug-in modules to have substantially the same form factor.

It should be noted that buses 1502 and 1502 of FIG. 14 illustrate connector coupling and that there are many ways to implement such illustrated electrical coupling in accordance with the present invention. For example, the signal paths comprising any of the buses 1501, 1502 may be routed over a wider or more narrow area than is indicated in FIG. 14 and also may be routed over any number of layers of a printed circuit board or other backplane medium.

Figure 15:
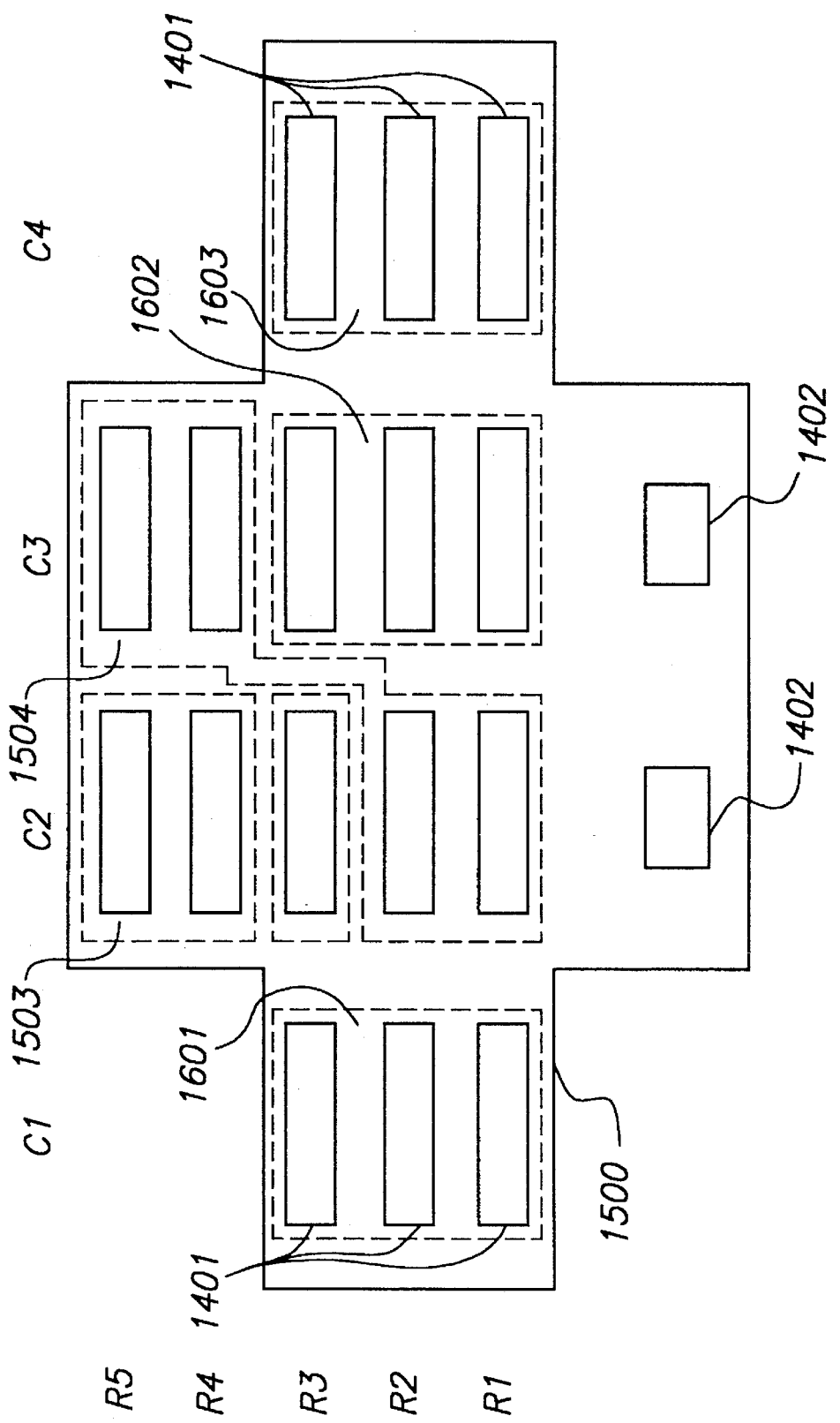
FIG. 15 is a front view of a bottom backplane in accordance with the present invention.

There is illustrated in FIG. 15 a front view of backplane 1500 in accordance with the present invention. Backplane 1500 is a bottom backplane and may be used when expandable chassis 800 is configured with only one shelf 805 or when chassis 800 is expanded by the addition of a shelf and an expansion backplane, for example expansion backplane 1600 as discussed below. Backplane 1500 has an extended bottom portion having two power connectors 1402 on the back side for mating to complementary connectors 909 on a power supply backplane 908 mounted to base unit 801 or to power expansion unit 900. Backplane 1500 also has sixteen backplane connectors 1401 positioned in five connector rows R1–R5 (corresponding to the five plug-in module slots of shelf 805) and in one of four columns C1–C4. Backplane 1500 additionally has a total of five buses: two central buses 1503, 1504 and three private buses 1601–1603.

As illustrated, backplane 1500 is adapted to receive a central plug-in module 1200 in slots corresponding to rows R4 and R5. Thus, connectors in positions (C2, R5), (C2, R4), (C3, R5), and (C3, R4) are positioned to receive a central plug-in module 1200 and buses 1503, 1504 which are coupled to such connectors are central buses. Central bus 1503 electrically couples backplane connectors in positions (C2, R5), (C2, R4) and (C2, R3). Central bus 1504 electrically couples backplane connectors in positions (C2, R2), (C2, R1), (C3, R4) and (C3, R5). Private buses 1601–1603 are placed in columns C1, C3 and C4 of rows R1, R2, and R3 to couple any plug-in modules 1300b received in slot positions R1, R2, and R3. Private bus 1601 electrically couples backplane connectors in column C1. Private bus 1602 electrically couples connectors positioned in column C3 and rows R1–R3. Private bus 1603 electrically couples connectors positioned in column C4. In accordance with this configuration, central plug-module 1200 is received in a slot corresponding to row R5 and/or row R4. Plug-in modules 1300a, 1300b are inserted in any slots corresponding to rows R1–R3. When inserted, any central plug-in modules 1200 in either slot positions R4 or R5 are electrically coupled to central buses 1503 and 1504 and are therefore coupled to any plug-in module 1300a, 1300b received in rows R1–R3. Such a configuration facilitates communication between central plug-in modules 1200 and plug-in modules 1300a, 1300b using central buses 1503 and 1504. Backplane 1500 is particularly advantageous for applications requiring redundant central plug-in modules 1200 because an active module can be plugged into slot position R5 and a back-up module can be plugged into slot position R4. Additionally, if a redundant (second) central plug-in module 1200 is not required, a plug-in module 1300a may be installed in-the free slot position R4 or R5. This interchangeability with respect to slot positions R4 and R5 is enabled because backplane 1500 has connectors 1401 in positions (C2, R4) and (C2, R5) which are coupled to central bus 1503. If a plug-in module 1300a (having a single connector 1201) is installed in either slot position R4 or R5, the backplane connector in position (C3, R4) or (C3, R5) respectively, would not be used. It should be noted however, that if a plug-in module 1300b (having four connectors) is installed in slot position R4 or R5, interference might occur between plug-in module 1300b and central bus 1504, so slot rows R4 and R5 may not accommodate such modules.

Backplane 1500 is not perfectly rectangular, but has notches cut out on the upper left and upper right corners (columns C1 and C4). The notches are rectangular cut-outs to accommodate simultaneous use with an expansion backplane (for example, expansion backplane 1600 as illustrated in FIG. 16) having a complementary (reciprocal) shape in the event that an additional shelf 805 is added to expandable chassis 800.

Figure 16:
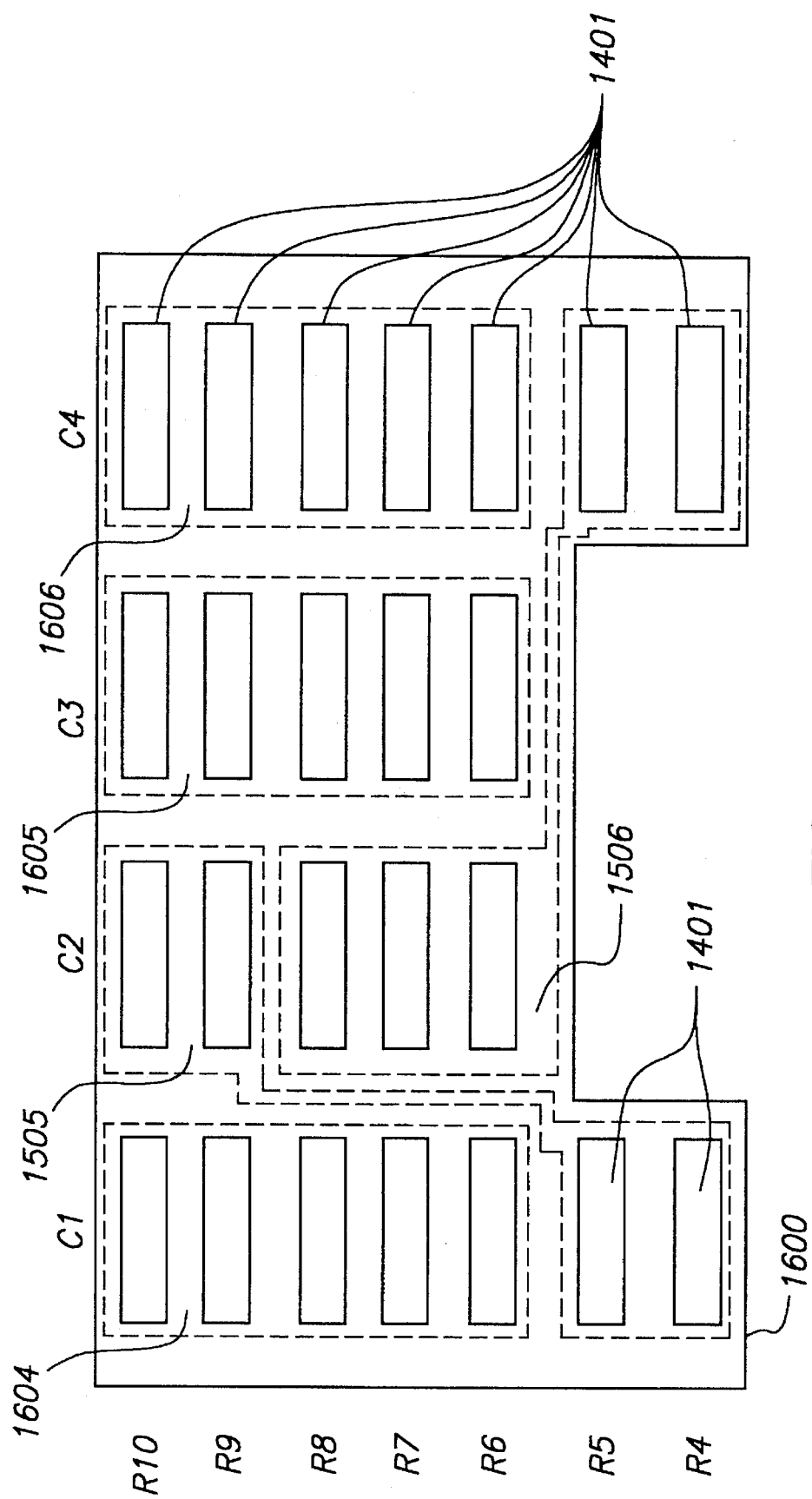
FIG. 16 is a front view of an expansion backplane in accordance with the present invention.

There is illustrated in FIG. 16 a front view of expansion backplane 1600 in accordance with the present invention. Expansion backplane 1600 has two central buses, 1505 and 1506, three private buses 1604–1606 and 24 backplane connectors 1401. Expansion backplane 1600 has a rectangular shape with two projections to accommodate connectors 1401 in positions (C1, R5), (C1, R4) and (C4, R5), (C4, R4).

Private buses 1604–1606 of expansion backplane 1600 electrically couple connectors positioned within the same column. Private bus 1604 electrically couples connectors 1401 in positions (C1, R10), (C1, R9), (C1, R8), (C1, R7) and (C1, R6). Private bus 1605 electrically couples connectors 1401 in positions (C3, R10), (C3, R9), (C3, R8), (C3, R7) and (C3, R6). Private bus 1606 electrically couples connectors 1401 in positions (C4, R10), (C4, R9), (C4, R8), (C4, R7) and (C4, R6). Central bus 1505 electrically couples connectors 1401 in positions (C2, R10), (C2, R9), (C1, R5), and (C1, R4). Central bus 1506 electrically couples connectors 1401 in positions (C2, R8), (C2, R7), (C2, R6), (C4, R5), and (C4, R4).

Figure 17:
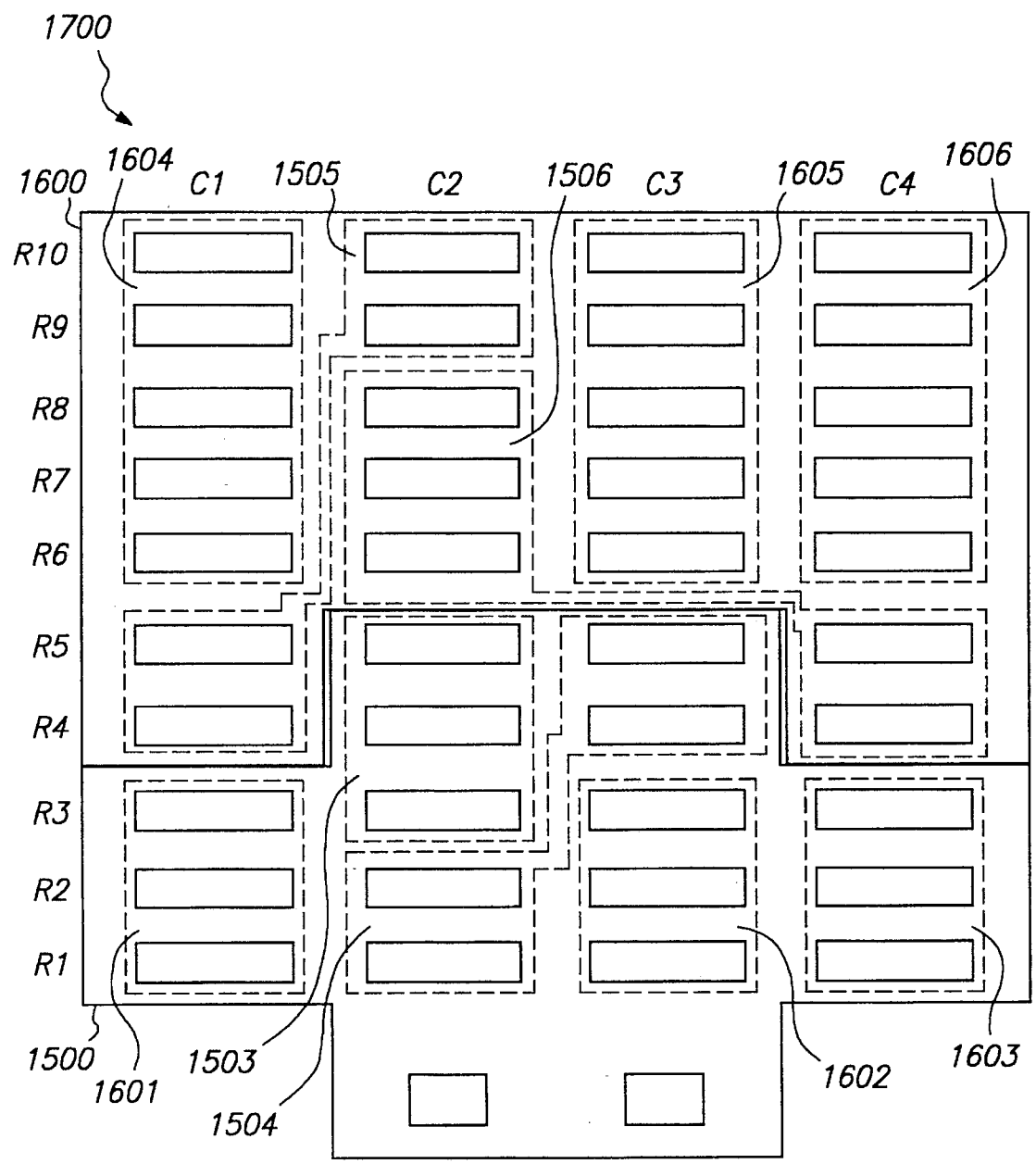
FIG. 17 is a front view of a composite backplane in accordance with the present invention.

Expansion backplane 1600 and bottom backplane 1500, when used together, form a two-piece modular or composite backplane 1700 (also called expanded backplane) 1700 as illustrated in FIG. 17. Such an expanded backplane 1700 is used with chassis 800 having two shelves 805. Chassis 800 is expanded from one shelf to two shelves by installing a second shelf 805 above a first shelf 805 of chassis 800. Stabilizing plate 1007 provides precise alignment of and maintains the mechanical tolerance between shelves 805 so that expansion backplane 1600 can span multiple shelves 805. Backplanes 1500 and 1600 are attached to shelf stabilizing plates 1007 and are co-planar when attached. Expansion backplane 1600 has a shape such that when attached to the second shelf 805, the connectors in positions (C1, R5), (C1, R4) and (C4, R5), (C4, R4) are aligned with and can mate with corresponding connectors 1201 on a central plug-in module 1200 to couple central plug-in module 1200 to central bus 1505 and 1506, respectively. Advantageously, expansion backplane 1600 associated with added shelf 805 extends to the first shelf 805 so that backplane 1600 can directly couple to central plug-in modules 1200. Such direct coupling reduces signal degradation and transmission-line effects.

Referring to FIG. 17, expanded backplane 1700 has four central buses, 1503–1506, six private buses 1601–1606 and ten rows R1–R10 of connectors 1401. Chassis 800, when configured with two shelves 805 and composite backplane 1700 may receive a central plug-in module 1200 in slot positions R4 and/or R5 and plug-in modules 1300a, 1300b in slots R1–R3 and R6–R10. Private buses 1601–1603 couple any plug-in modules 1300b received in slot positions R1–R3 and private buses 1604–1606 couple any plug-in modules 1300b received in slot positions R6–R10. Private buses 1604–1606 allow private communications among plug-in modules 1300b installed in positions R6–R10 and private buses 1601–1603 allow private communications among plug-in modules 1300b installed in positions R1–R3. It should be noted that there is no explicit electrical connection between private buses 1601–1603 on bottom backplane 1500 and private buses 1604–1606 on expansion backplane 1600 when both are installed in chassis 800, so that two distinct sets of private buses 1601–1603 and 1604–1606 are provided. Depending on the application requirements, the private buses 1601–1603 and 1604–1606 could be split into additional distinct sets, for example, by breaking private bus connections between row R8 and row R9 of expansion backplane 1600.

Advantageously, central plug-in modules 1200 are positioned near the vertical center (rows R4, R5) of the expanded chassis 800 with two shelves 805. Such vertical positioning minimizes the worst-case length of central buses 1503–1506 and thereby reduces signal delay and degradation due to transmission-line effects, as compared to the delay and degradation due to transmission-line effects of a similar size system with central plug-in modules positioned at the top or bottom of the system.

Figure 18:
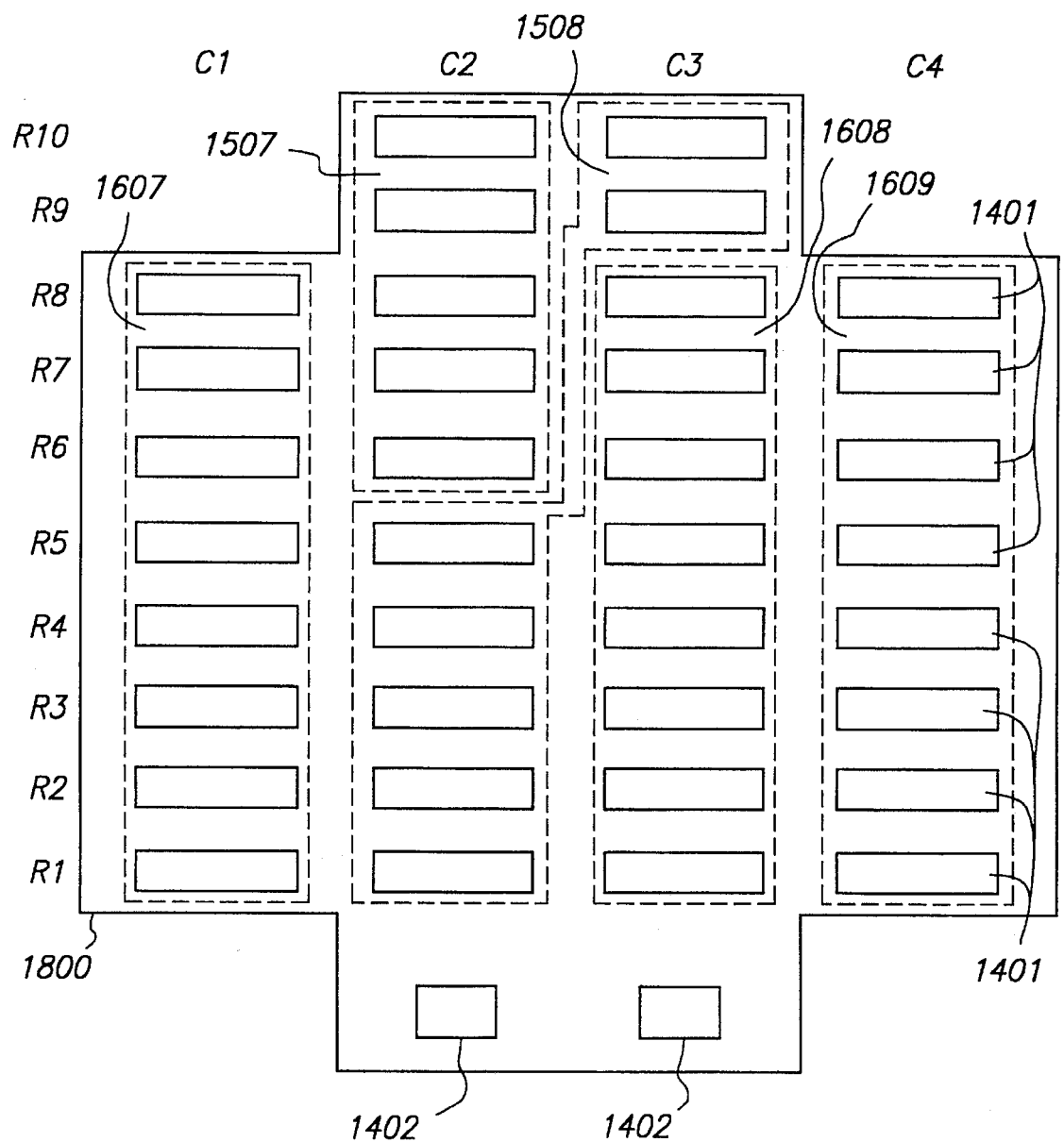
FIG. 18 is a front view of a bottom backplane in accordance with the present invention.

There is illustrated in FIG. 18 a front view of alternative bottom backplane 1800 having 36 connectors 1401 in ten rows R1–R10 and aligned in four columns C1–C4 and two power connectors 1402. Bottom backplane 1800 can be used as a bottom backplane in chassis 800 having two or more shelves 805. When bottom backplane 1800 is used, slots positioned in rows R9 and R10 are central slots for receiving central plug-in modules 1200. Bottom backplane 1800 has two central buses 1507, 1508 and three private buses 1607–1609. Bottom backplane 1800 has a shape complementary to the shape of expansion backplanes 1600, 1900 to facilitate formation of a composite backplane.

Private buses 1607–1609 of bottom backplane 1800 electrically couple connectors positioned within the same column. Private bus 1607 electrically couples connectors 1401 in positions (C1, R8), (C1, R7), (C1, R6), (C1, R5), (C1, R4), (C1, R3), (C1, R2), and (C1, R1). Private bus 1608 electrically couples connectors 1401 in positions (C3, R8), (C3, R7), (C3, R6), (C3, R5), (C3, R4), (C3, R3), (C3, R2), and (C3, R1). Private bus 1609 electrically couples connectors 1401 in positions (C4, R8), (C4, R7), (C4, R6), (C4, R5), (C4, R4), (C4, R3), (C4, R2), and (C4, R1). Central bus 1507 electrically couples connectors 1401 in positions (C2, R10), (C2, R9), (C2, R8), (C2, R7) and (C2, R6). Central bus 1508 electrically couples connectors 1401 in positions (C2, R5), (C2, R4), (C2, R3), (C2, R2), (C2, R1), (C3, R10) and (C3, R9).

Like bottom backplane 1500, backplane 1800 has notches in the upper left and upper right corners to have a form complementary to expansion backplanes such as expansion backplane 1600 to form a composite backplane. For example, when bottom backplane 1800 is combined with expansion backplane 1600, the resulting composite backplane is used in a chassis 800 having three shelves 805 to create an expanded system with four central buses and fifteen positions for receiving plug-in modules 1200, 1300a, 1300b.

Figure 19:
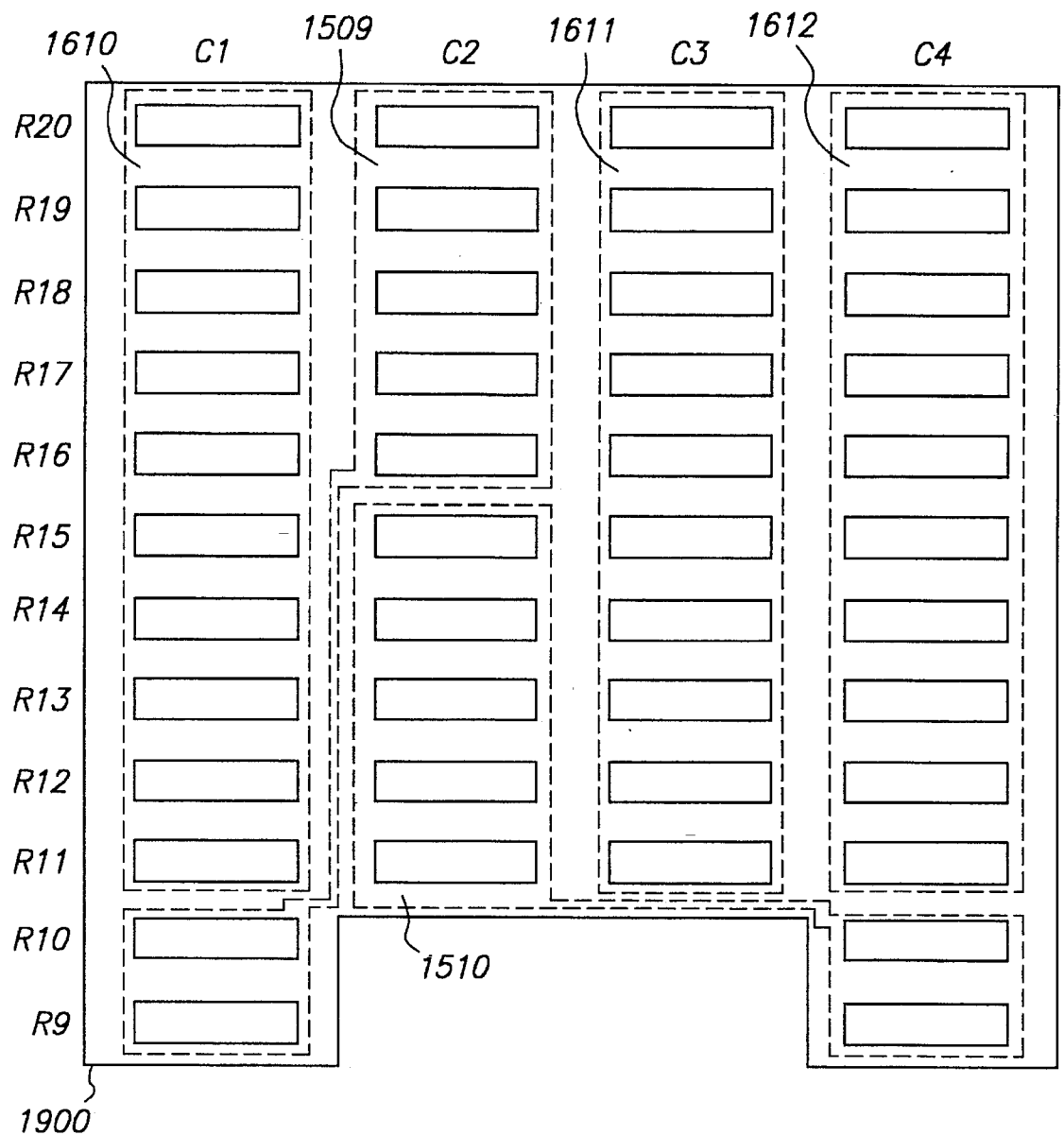
FIG. 19 is a front view of an expansion backplane in accordance with the present invention.

There is illustrated in FIG. 19 a front view of alternative expansion backplane 1900 having 44 connectors 1401 in 12 rows R9–R20 and aligned in four columns C1–C4. Expansion backplane 1900 can be used as an expansion backplane in chassis 800 having three or more shelves 805. Expansion backplane 1900 has two central buses 1509 and 1510 and three private buses 1610–1612. Expansion backplane 1900 has a shape complementary to the shape of bottom backplanes 1500, 1800 to facilitate formation of a composite backplane.

Private buses 1610–1612 of expansion backplane 1900 electrically couple connectors positioned within the same column (Columns C1, C3, C4). Private bus 1610 electrically couples connectors 1401 in positions (C1, R20), (C1, R19), (C1, R18), (C1, R17), (C1, R16), (C1, R15), (C1, R14), (C1, R13), (C1, R12), and (C1, R11). Private bus 1611 electrically couples connectors 1401 in positions (C3, R20), (C3, R19), (C3, R18), (C3, R17), (C3, R16), (C3, R15), (C3, R14), (C3, R13), (C3, R12), and (C3, R11). Private bus 1612 electrically couples connectors 1401 in positions (C4, R20), (C4, R19), (C4, R18), (C4, R17), (C4, R16), (C4, R15), (C4, R14), (C4, R13), (C4, R12), and (C4, R11). Central bus 1509 electrically couples connectors 1401 in positions (C2, R20), (C2, R19), (C2, R18), (C2, R17), (C24, R16), (C1, R10) and (C1, R9). Central bus 1510 electrically couples connectors 1401 in positions (C2, R15), (C2, R14), (C2, R13), (C2, R12), (C2, R11), (C4, R10) and (C4, R9). It should be noted that connectors 1401 in positions (C1, R10), (C1, R9), (C4, R10) and (C4, R9) correspond to slot rows R10 and R9 which receive central plug-in modules 1200.

Like expansion backplane 1600, backplane 1900 has extended lower left and lower right corners to have a form complementary to bottom backplanes such as bottom backplane 1500 or 1800 to form a composite backplane when combined with either backplane. For example, when expansion backplane 1900 is combined with bottom backplane 1800, the resulting composite backplane is used in a chassis

800 having four shelves 805 to create an expanded system with four central buses and twenty positions for receiving plug-in modules 1200, 1300a, 1300b.

Figure 20:
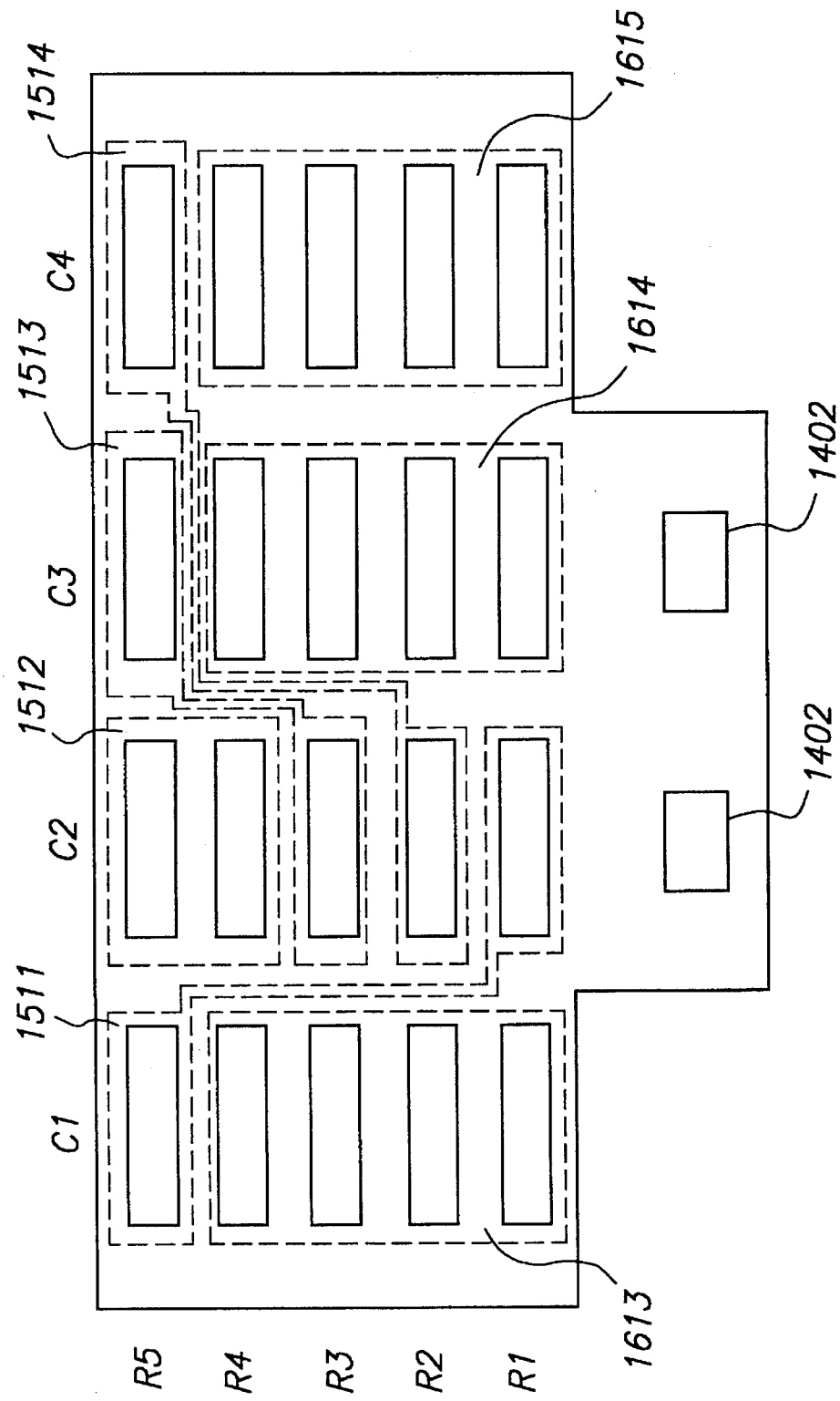
FIG. 20 is a front view of a non-expandable backplane in accordance with the present invention.

There is illustrated in FIG. 20 an alternative backplane 2000 having 20 connectors 1401 in 5 rows R1–R5 and aligned in four columns C1–C4. Backplane 2000 also has two backplane power connectors 1402 on the back side for coupling to a power backplane. Backplane 2000 has four central buses 1511–1514 and three private buses 1613–1615.

Private buses 1613–1615 of backplane 2000 electrically couple connectors positioned within the same column. Private bus 1613 electrically couples connectors 1401 in positions (C1, R4), (C1, R3), (C1, R2) and (C1, R1). Private bus 1614 electrically couples connectors 1401 in positions (C3, R4), (C3, R3), (C3, R2) and (C3, R1). Private bus 1615 electrically couples connectors 1401 in positions (C4, R4), (C4, R3), (C4, R2) and (C4, R1). Central bus 1511 electrically couples connectors 1401 in positions (C1, R5) and (C2, R1). Central bus 1512 electrically couples connectors 1401 in positions (C2, R5) and (C2, R4). Central bus 1513 electrically couples connectors 1401 in positions (C2, R3) and (C3, R5). Central bus 1514 electrically couples connectors 1401 in positions (C2, R2) and (C4, R5).

Backplane 2000 is a non-expandable backplane and has connector and bus coupling for receiving a central plug-in module 1200 in a slot corresponding to row R5 and plug-in modules 1300a, 1300b in rows R1–R4. Backplane 2000 can be used in configurations requiring each plug-in module 1300a, 1300b to have a dedicated central bus for coupling to central module 1200.

It should be noted that central buses 1501–1514 and private buses 1601–1615 of FIGS. 14–20 illustrate connector coupling and that there are many ways to implement such illustrated electrical coupling in accordance with the present invention. For example, the signal paths comprising any of the buses may be routed over a wider or more narrow area than is indicated in FIGS. 14–20 and also may be routed over any number of layers of a printed circuit board or other backplane medium.

Using one to four shelves 805 and backplanes 1500, 1600, 1800, 1900, and 2000, a family of system configurations of chassis 800 can be created, having two to four central buses, accommodating five to twenty plug-in modules 1300a, 1300b, 1200, and providing one, two, or more sets of private buses. Table 1 summarizes the characteristics of these configurations.

configuration without discarding or replacing the mechanical components of the original configuration.

Chassis 800 is expanded in accordance with the present invention by attaching an additional shelf 805 to chassis 800. The added shelf 805 is aligned using the shelf stabilizing plates 1007 designed to maintain mechanical tolerances. Additionally, an expansion backplane 1600 or 1900 is also attached to shelf stabilizing plate 1007.

With any of the configurations listed in Table 1, it is possible to have either a single base unit 801 accommodating up to three power supply modules or a single base unit 801 with added power expansion units 900 installed between base unit 801 and shelves 805. A single power backplane is used which spans not only base unit 801 but also each power expansion unit 900 installed in chassis 800.

Various methods of power distribution may be used to distribute power to expansion backplanes 1600 and 1900. The preferred method is to connect cables from the leftmost and rightmost power connectors 909 on power backplane 908 to expansion backplane 1600 or 1800. Another method is to "daisy-chain" the power using a cable connection between the bottom backplane 1500 or 1800 and the expansion backplane 1600 or 1900.

The second embodiment has been described with a number of buses connecting the central plug-in modules 1200 to plug-in modules 1300a, 1300b. FIGS. 14 through 20 show the electrical coupling between connectors 1401 on the respective backplanes. However, not all the connections between connectors 1401 need follow the suggested coupling. For example, those skilled in the art, after reviewing this disclosure, will recognize that some signals, such as power and ground, may be connected globally, while others, such as clocks, resets, and other special signals, may have special arrangements dictated by the application. Also, some non-electrical (e.g., optical) signals may be used in some embodiments.

The description of the second embodiment has shown all of the positions in which backplane connectors 1401 can be placed. A particular embodiment need not populate or make use of all of these positions. Also, backplane connectors 1401 (and their mates 1201 on the plug-in modules 1300a, 1300b, and 1200) need not have identical style and number of electrical contacts in all positions. For example, private buses 1601–1615 may use a different style of connector than central buses 1501–1514. Also, central plug-in modules 1200 may use a different style of connector than plug-in

TABLE 1

(Expandable chassis configurations)

| # of shelves | bottom backplane | expansion backplane | # of buses | central slots | # of modules | # of non-central modules per bus |
|---|---|---|---|---|---|---|
| 1 | 1500 | — | 2 | R4, R5 | 5 | 2 |
| 1 | 2000 | — | 4 | R5 | 5 | 1 |
| 2 | 1500 | 1600 | 4 | R4, R5 | 10 | 2–3 |
| 2 | 1800 | — | 2 | R9, R10 | 10 | 4–5 |
| 3 | 1500 | 1900 | 4 | R4, R5 | 15 | 2–5 |
| 3 | 1800 | 1600 | 4 | R9, R10 | 15 | 2–5 |
| 4 | 1800 | 1900 | 4 | R9, R10 | 20 | 4–5 |

When expandable chassis 800 is assembled according to the present invention, any pre-existing configuration having only two central buses can be expanded into a larger modules 1300a and 1300b in some or all columns, for example, to provide a greater number of electrical contacts. However, a connector position that accommodates a central plug-in module 1200 connector 1201, such as position R4 in FIG. 15, can optionally accommodate a plug-in module 1300*a*, 1300*b* connector only if the two module types have compatible connectors in the appropriate column(s) (i.e. column C2 in FIG. 15) or if the plug-in module has no connectors or components in a position that would interfere with the backplane.

The backplanes thus far described are completely passive; that is, they contain no active circuitry such as digital logic, or passive circuitry such as resistors and capacitors. However, backplanes in accordance with the disclosed invention may be adapted to contain active and/or passive circuitry as required for specific applications. For example, a backplane in accordance with the present invention could contain active or passive circuitry to provide filtering or signal terminations, or active circuitry for the purpose of clock distribution, reset control, thermal alarms, and other specialized functions.

Besides minimizing the maximum length of central buses 1501–1514, positioning the central plug-in cards 1200 near the vertical center of chassis 800 has another advantage: the ability to support hybrid or mixed configurations. That is, connectors 1201, buses 1501–1514 and signal definitions used by plug-in modules 1300*a*, 1300*b* received by bottom backplane 1500 or 1800 need not be identical to those used by expansion backplane 1600 or 1900.

For example, in a network data processing system, central buses coupling to connectors positioned in columns C2 and C3 could be defined and adapted to handle packets of data for Ethernet and FDDI (Fiber Distributed Data Interface) networks, while central buses coupling to connectors positioned in columns C1 and C4 could be adapted to handle data cells for ATM (Asynchronous Transfer Mode) networks. The bus requirements for such networks can be different. Using expandable chassis 800 in accordance with the present invention, it is possible to configure a system that handles each type of data optimally within its own domain (i.e. Ethernet corresponding to bottom backplanes 1500, 1800 and ATM corresponding to expansion backplanes 1600, 1900). In such a configuration, the connection between the Ethernet domain and the ATM domain can be made efficiently by central plug-in module 1200 which has access to the buses for both domains.

As a cost saving measure in the second embodiment, each of the bottom backplanes 1400, 1500, 1800, 2000 can be combined with a power backplane 908 to form a single, planar bottom/power backplane. This eliminates the need for power connectors 1402 on the bottom backplanes and their mates 909 on the power backplane 908. In this case, the stand-offs shown between stabilizing plates 907 and 1007 in FIG. 8 are also eliminated to allow the stabilizing plates to form a single planar unit and to allow the single bottom/power backplane to span the base unit 801 and shelf or shelves 805. Different bottom/power backplanes are used if one or more power expansion units 900 are installed.

The first and second embodiments have illustrated only two possible sets of shapes and arrangements of shelves, plug-in modules, and backplanes. It will be apparent to those skilled in the art, after reviewing this disclosure, that the invention allows many different shapes and arrangements and expansion options to be devised according to the needs of a particular data processing system. For example, some embodiments may have differing numbers horizontal connector positions or columns, numbers of plug-in modules per shell or maximum number of shelves per system. In some embodiments, the shelf stabilizing plate used in one shelf in a given system may have a different pattern of cutouts than the plate used in another shelf in the same system. Similarly, two shelves in a given system may have different heights and may accept differing numbers of plug-in modules.

The foregoing discussion discloses and describes merely exemplary methods and embodiments of the present invention. As will be understood by those familiar with the art and using the teachings of this disclosure, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A modular chassis for receiving a first and second plurality of circuit boards each having an electrical connector on a leading edge of the circuit board and a central board with first and second electrical connectors on a leading edge of the central board, the chassis comprising:

a circuit board housing adapted to receive the first plurality of circuit boards and adapted to planarly align the electrical connectors of the first plurality of circuit boards in a first spatial location, the housing adapted to receive the second plurality of circuit boards and adapted to planarly align the electrical connectors of the second plurality of circuit boards in a second spatial location, the housing adapted to receive the central board and adapted to planarly align the first and second electrical connectors of the central board in third and fourth spatial locations;

a first planar backplane supported by the housing, the backplane having a first plurality of electrical connectors in the first spatial location and an electrical connector in the third spatial location for electrically interconnecting the first plurality of circuit boards and the central board; and a second planar backplane supported by the housing, the backplane having a second plurality of electrical connectors in the second spatial location and an electrical connector in the fourth spatial location for electrically interconnecting the second plurality of circuit boards and the central board.

2. The modular chassis of claim 1 wherein the first and second plurality of connectors of the first and second backplanes are vertically aligned in a horizontal position for receiving a plurality of processing cards having a common form factor.

3. The modular chassis of claim 1 further comprising a power unit adapted to receive at least one power supply and wherein the first and second backplanes extend to the power unit and are electrically coupled to the power unit for supplying power to the first and second plurality of circuit boards received in the housing.

4. An expandable chassis for receiving a first plurality of circuit boards each having an electrical connector on a leading edge of the circuit board and a second plurality of circuit boards each having a first and a second electrical connector on a leading edge of the circuit board, the chassis comprising:

a first removable circuit board housing adapted to receive the first plurality of circuit boards and adapted to planarly align the electrical connectors of the first plurality of circuit boards in a first spatial location;

a second removable circuit board housing mounted adjacent to the first circuit board housing, the second circuit board housing adapted to receive the second plurality of circuit boards and adapted to planarly align the first and second electrical connectors of the second plurality of circuit board in second and third spatial locations;

a first planar backplane mounted to the first housing, the backplane having a plurality of electrical connectors in the first spatial location and a plurality of electrical connector in the second spatial location for electrically interconnecting the first plurality of circuit boards and the second plurality of circuit boards; and a second planar backplane mounted to the second housing, the backplane having a plurality of electrical connectors in the third spatial location for electrically interconnecting the second plurality of circuit boards.

5. The expandable chassis of claim 4 further comprising first and second interlockable frame plates mounted to the first and second removable circuit board housings respectively, each frame plate having a first edge with a recessed lip, a first and second mounting hole in the recessed lip, a second edge opposite to the first edge having a form complementary to the first edge, the second edge having third and fourth mounting holes aligned with the first and second mounting holes of the first edge for interlocking to an adjacent frame plate.

6. The expandable chassis of claim 4 further comprising a power unit adapted to receive at least one power supply and wherein the first and second backplanes extend to the power unit and are electrically coupled to the power unit for supplying power to the first and second plurality of circuit boards received in the first and second housings.

7. An expandable chassis for receiving a first and second plurality of circuit boards each having an electrical connector on a leading edge of the circuit board and a central board with first and second electrical connectors on a leading edge of the central board, the chassis comprising:

a first removable circuit board housing adapted to receive the first plurality of circuit boards and adapted to planarly align the electrical connectors of the first plurality of circuit boards in a first spatial location;

a second removable circuit board housing mounted adjacent to the first circuit board housing; the second circuit board housing adapted to receive the second plurality of circuit boards and adapted to planarly align the electrical connectors of the second plurality of circuit boards in a second spatial location;

a third removable circuit board housing mounted adjacent to the second circuit board housing, the third circuit board housing adapted to receive the central board and adapted to planarly align the first and second electrical connectors of the central board in third and fourth spatial locations;

a first planar backplane mounted to the first housing, the backplane having a first plurality of electrical connectors in the first spatial location and an electrical connector in the third spatial location for electrically interconnecting the first plurality of circuit boards and the central board; and a second planar backplane mounted to the second housing, the backplane having a second plurality of electrical connectors in the second spatial location and an electrical connector in the fourth spatial location for electrically interconnecting the second plurality of circuit boards and the central board.

8. The expandable chassis of claim 7 further comprising first, second and third interlockable frame plates mounted to the first, second and third removable circuit board housings respectively, each frame plate having a first edge with a recessed lip, a first and second mounting hole in the recessed lip, a second edge opposite to the first edge having a form complementary to the first edge, the second edge having third and fourth mounting holes aligned with the first and second mounting holes of the first edge for interlocking to an adjacent frame plate.

9. The expandable chassis of claim 7 further comprising a power unit adapted to receive at least one power supply and wherein the first and second backplanes extend to the power unit and are electrically coupled to the power unit for supplying power to the first and second plurality of circuit boards received in the first and second housings.

10. An expandable data processing chassis for receiving and electrically coupling a plurality of processing boards each having a connector on a leading edge, the chassis comprising:

a plurality of stackable circuit board housings each mounted to an adjacent stackable circuit board housing by a mechanical attachment mechanism to form a fixed stack of adjacent circuit board housings, wherein the plurality of stackable circuit board housings comprise:

a central housing adapted to receive at least one circuit board and to planarly align the electrical connector of the received boards; and a plurality of card housings adapted to receive a plurality of circuit boards and to planarly align the electrical connector of the received boards to define connector positions; and a plurality of planar backplanes each associated with a card housing and the central housing, each planar backplane mounted to the associated card housing and having a form extending to the central housing, each planar backplane having a plurality of electrical connectors and a plurality of electrically conductive paths for electrically coupling the plurality of circuit boards in each card housing to the central circuit board.

11. The expandable data processing chassis of claim 10 further comprising a power unit adapted to receive at least one power supply and wherein the plurality of backplanes extend to the power unit and are electrically coupled to the power unit for supplying power to the plurality of circuit boards received in the plurality of card housings.

12. The expandable data processing chassis of claim 10 wherein the plurality of electrical connectors of each planar backplane are vertically aligned in a first horizontal position for receiving a plurality of circuit boards having a common form factor.

13. The expandable data processing chassis of claim 10 further comprising a plurality of interlockable frame plates each frame plate mounted to an associated card housing, each frame plate having a first edge with a recessed lip, a first and second mounting hole in the recessed lip, a second edge opposite to the first edge having a form complementary to the first edge, the second edge having third and fourth mounting holes aligned with the first and second mounting holes of the first edge for mounting to an adjacent frame plate.

14. An expandable data processing system comprising:

a plurality of stackable communication shelves each mounted on an adjacent stackable communication shelf by a mechanical attachment mechanism to form a fixed stack of communication shelves, wherein the plurality of stackable communication shelves comprise:

a plurality of processing modules each having at least one electrical connector, the electrical connectors being planarly aligned; and a central communication module having a plurality of planarly aligned electrical connectors; and a plurality of planar backplanes each associated with a processing shelf and the central communication shelf, each planar backplane mounted to the associated processing shelf and to the central communication shelf, each planar backplane having a complementary connector for each electrical connector of the associated processing shelf, the planar backplane extending to the central communication shelf for electrically coupling the plurality of electrical connectors of each processing shelf to one of the electrical connectors of the central communication shelf.

15. The expandable data processing system of claim 14 further comprising a power unit having at least one power supply and wherein the plurality of backplanes extend to the power unit and are electrically coupled to the power unit for supplying power to the stackable communication shelves.

16. The expandable data processing system of claim 14 further comprising a plurality of interlockable frame plates each frame plate mounted to an associated stackable communication shelf, each frame plate having a first edge with a recessed lip, a first and second mounting hole in the recessed lip, a second edge opposite to the first edge having a form complementary to the first edge, the second edge having third and fourth mounting holes aligned with the first and second mounting holes of the first edge for mounting to an adjacent frame plate.

17. A method for distributing electrical signals in an expandable chassis having first and second circuit board housings each adapted to receive a plurality of circuit boards, a third circuit board housing for receiving at least one circuit board and first and second planar backplanes, comprising the steps of:

coupling the first backplane to the first housing and to the third housing to electrically couple each circuit board received in the first housing to at least one circuit board received in the third housing; and coupling the second backplane to the second housing and to the third housing to electrically couple each circuit board received in the second housing to at least one circuit board received in the third housing.

18. The method of claim 17 further comprising the steps of:

coupling the first backplane to a power unit; and coupling-the second backplane to the power unit.

* * * * *